(12) United States Patent
Ikeda et al.

(10) Patent No.: US 11,393,855 B2
(45) Date of Patent: Jul. 19, 2022

(54) PHOTOELECTRIC CONVERSION APPARATUS, PHOTOELECTRIC CONVERSION SYSTEM, AND MOVING OBJECT

(71) Applicant: CANON KABUSHIKI KAISHA, Tokyo (JP)

(72) Inventors: Hajime Ikeda, Yokohama (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 77 days.

(21) Appl. No.: 16/693,114

(22) Filed: Nov. 22, 2019

(65) Prior Publication Data

US 2020/0176491 A1 Jun. 4, 2020

(30) Foreign Application Priority Data

Nov. 29, 2018 (JP) .............................. JP2018-224274

(51) Int. Cl.
*H01L 27/146* (2006.01)
*H01L 31/0224* (2006.01)
(Continued)

(52) U.S. Cl.
CPC ........ *H01L 27/14603* (2013.01); *G06T 7/593* (2017.01); *H01L 27/1462* (2013.01);
(Continued)

(58) Field of Classification Search
CPC ..................... H01L 27/1463; H01L 27/1461
See application file for complete search history.

(56) References Cited

U.S. PATENT DOCUMENTS 6,576,940 B2 * 6/2003 Maeda .............. H01L 27/14603
250/208.1
8,471,317 B2 * 6/2013 Suzuki .............. H01L 27/14623
257/294
(Continued)

FOREIGN PATENT DOCUMENTS

JP       2009-38309 A    2/2009
JP       2010-56345 A    3/2010
(Continued)

*Primary Examiner* — Jarrett J Stark
(74) *Attorney, Agent, or Firm* — Canon U.S.A., Inc. IP Division

(57) ABSTRACT

A photoelectric conversion apparatus includes a first semiconductor region of a first conductivity type at a first depth from a first surface, a second semiconductor region of a second conductivity type disposed at a second depth deeper than the first depth from the first surface so as to be in contact with the first semiconductor region, and a third semiconductor region of the second conductivity type extending from the first surface to a third depth shallower than the second depth and being in contact with the first semiconductor region and the second semiconductor region. The third semiconductor region has a higher impurity concentration than the second semiconductor region. A second electric potential lower than the first electric potential for a carrier of the first conductivity type is applied to the third semiconductor region. The second semiconductor region has an impurity concentration of $1 \times 10^{12}$ [atom/cm$^3$] or less.

25 Claims, 16 Drawing Sheets

(51) Int. Cl.
    *H01L 31/0216*     (2014.01)
    *G06T 7/593*     (2017.01)
    *H04N 5/225*     (2006.01)
    *H01L 31/0352*     (2006.01)

(52) U.S. Cl.
    CPC .... *H01L 27/1464* (2013.01); *H01L 27/14627* (2013.01); *H01L 27/14629* (2013.01); *H01L 27/14643* (2013.01); *H01L 31/02161* (2013.01); *H01L 31/022466* (2013.01); *H01L 31/035272* (2013.01); *H04N 5/2253* (2013.01); *G06T 2207/10012* (2013.01); *G06T 2207/30261* (2013.01); *H01L 27/1463* (2013.01); *H01L 27/14612* (2013.01)

(56) References Cited

U.S. PATENT DOCUMENTS

| | | | |
|---|---|---|---|
| 8,546,902 B2* | 10/2013 | Tamura | H01L 27/14601 257/463 |
| 10,686,086 B2* | 6/2020 | Endo | H01L 31/02327 |
| 2006/0027844 A1* | 2/2006 | Jung | H01L 27/14689 257/291 |
| 2006/0065896 A1* | 3/2006 | Abe | H01L 27/14643 257/69 |
| 2009/0045321 A1* | 2/2009 | Bae | H01L 27/14689 250/208.1 |
| 2009/0050997 A1* | 2/2009 | Mutoh | H01L 27/14641 257/440 |
| 2010/0066882 A1 | 3/2010 | Nagai | |
| 2010/0327391 A1* | 12/2010 | McCarten | H01L 27/14609 257/447 |
| 2011/0298078 A1 | 12/2011 | Ha | |
| 2012/0295390 A1* | 11/2012 | Fisher | C09K 13/02 438/71 |
| 2012/0329200 A1* | 12/2012 | Krishnan | H01L 31/186 438/71 |
| 2013/0025663 A1* | 1/2013 | Liu | H01L 31/02363 136/256 |
| 2014/0111664 A1* | 4/2014 | Kumano | H01L 27/1462 348/222.1 |
| 2015/0263058 A1* | 9/2015 | Konstantin | H01L 27/1461 257/292 |
| 2017/0323912 A1* | 11/2017 | Lahav | H01L 27/14623 |
| 2018/0233540 A1* | 8/2018 | Saito | H01L 51/442 |
| 2020/0176490 A1* | 6/2020 | Ikeda | H01L 27/14629 |
| 2020/0176491 A1* | 6/2020 | Ikeda | H01L 27/14464 |
| 2020/0258923 A1* | 8/2020 | Ono | H01L 27/146 |
| 2020/0350346 A1* | 11/2020 | Ohura | H01L 27/1461 |
| 2021/0151478 A1* | 5/2021 | Iwabuchi | H01L 27/14614 |

FOREIGN PATENT DOCUMENTS

| | | |
|---|---|---|
| JP | 2010-73906 A | 4/2010 |
| JP | 2011-253963 A | 12/2011 |

* cited by examiner

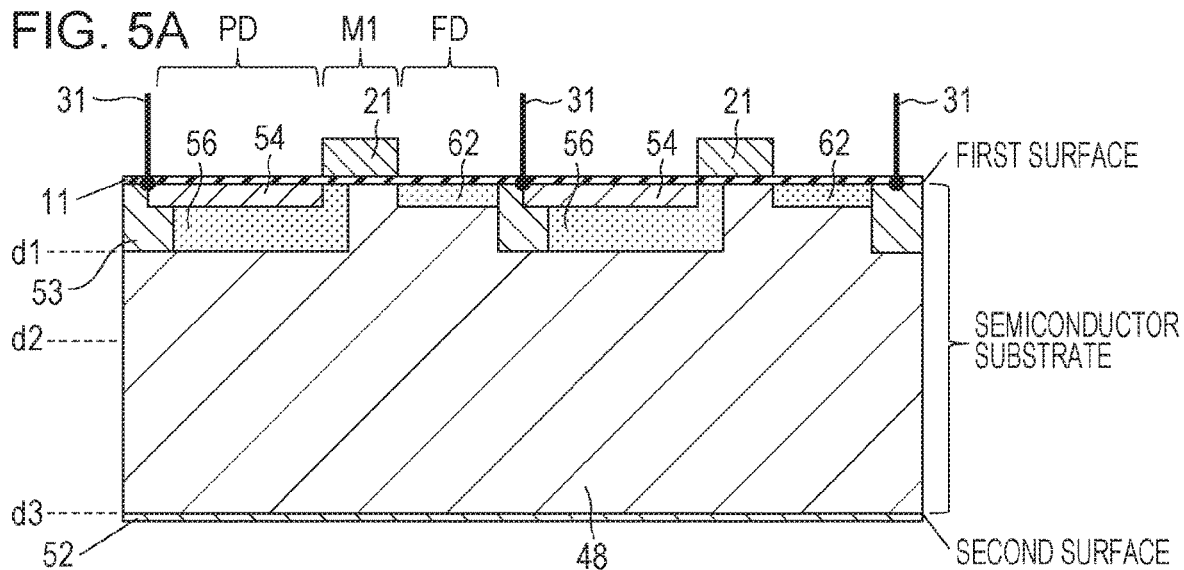
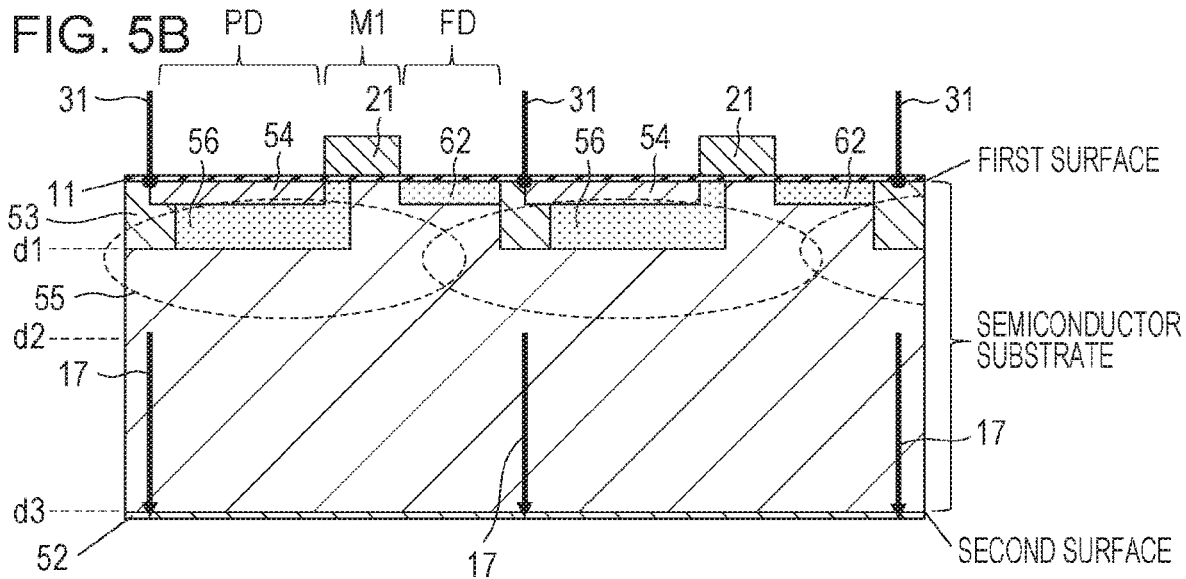
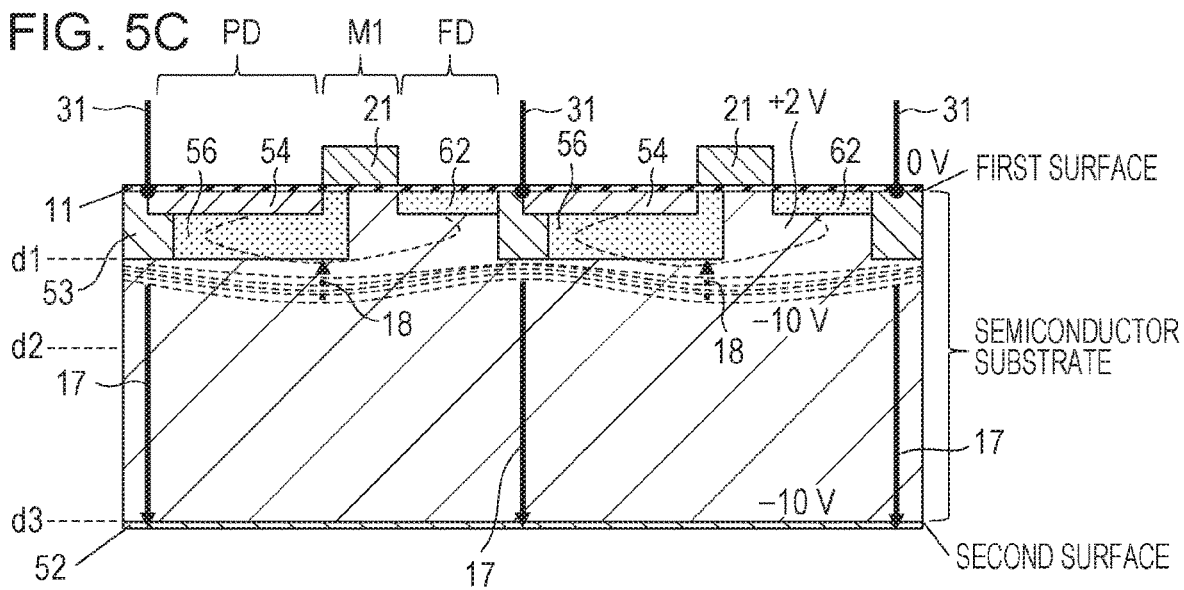

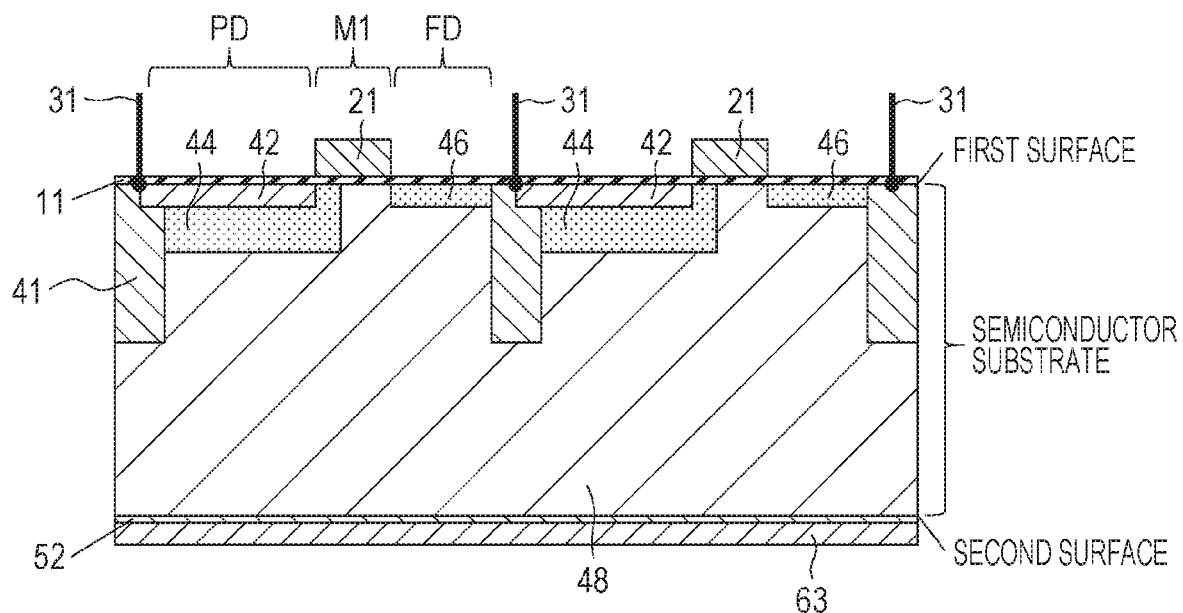
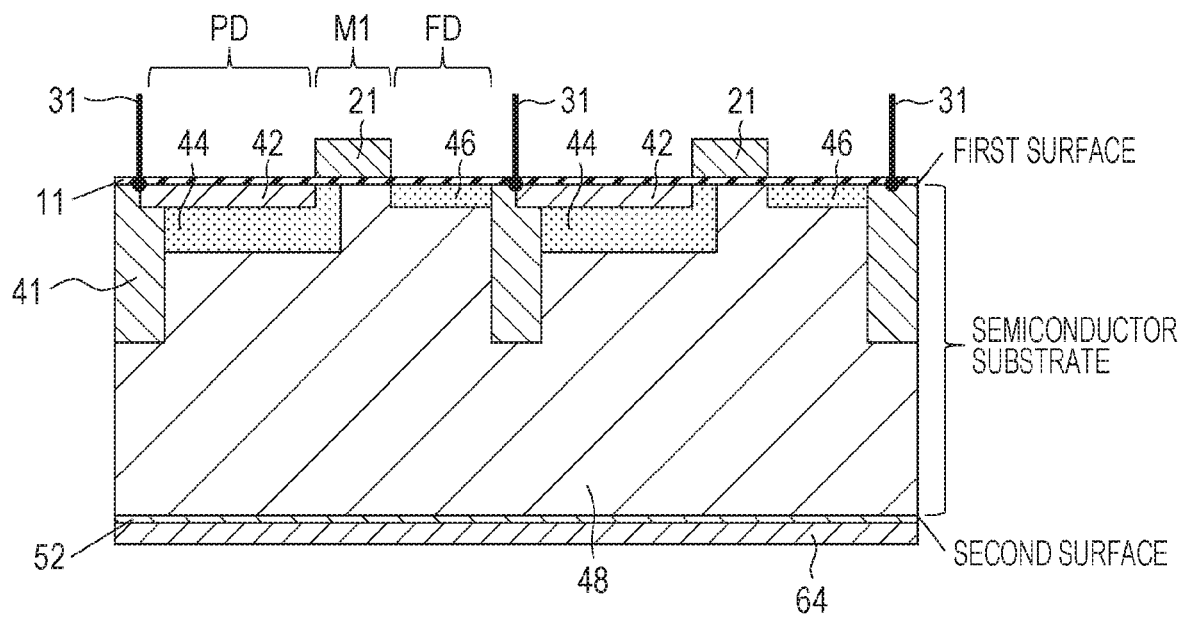

PHOTOELECTRIC CONVERSION APPARATUS, PHOTOELECTRIC CONVERSION SYSTEM, AND MOVING OBJECT

BACKGROUND

Field

One disclosed aspect of the embodiments relates to a photoelectric conversion apparatus, a photoelectric conversion system including the photoelectric conversion apparatus, and a moving object including the photoelectric conversion apparatus.

Description of the Related Art

Photoelectric conversion apparatuses are under study that photoelectrically convert long-waveform light, such as visible light with red wavelengths, near infrared light, and infrared light. A known photoelectric conversion apparatus has a photoelectric conversion unit in a deep region of a semiconductor substrate to enhance photoelectric conversion efficiency for long-wavelength light.

A photoelectric conversion apparatus disclosed in Japanese Patent Laid-Open No. 2010-56345 may enhance the sensitivity for infrared light by forming a deep depletion layer in each pixel to reduce crosstalk between the pixels for visible light.

SUMMARY

A photoelectric conversion apparatus according to an aspect of the embodiments includes a semiconductor substrate having a first surface and a second surface. The semiconductor substrate includes at least one first semiconductor region, a second semiconductor region, and a third semiconductor region. The first semiconductor region is of a first conductivity type at a first depth from the first surface. The second semiconductor region is of a second conductivity type disposed at a second depth deeper than the first depth from the first surface so as to be in contact with the first semiconductor region. The second semiconductor region receives a first electric potential from the second surface. The third semiconductor region is of the second conductivity type extending from the first depth to a third depth shallower than the second depth and being in contact with the first semiconductor region and the second semiconductor region. The third semiconductor region has a higher impurity concentration than the second semiconductor region. A second electric potential lower than the first electric potential is applied to the third semiconductor region. The second electric potential is an electric potential for an electric charge serving as a carrier of a semiconductor region of the first conductivity type. The second semiconductor region has an impurity concentration of $1 \times 10^{12}$ [atom/cm$^3$] or less.

Further features of the disclosure will become apparent from the following description of exemplary embodiments with reference to the attached drawings.

BRIEF DESCRIPTION OF THE DRAWINGS

FIGS. 5A to 5C are cross-sectional views of pixels.

FIG. 8 is a cross-sectional view of pixels.

FIG. 9 is a cross-sectional view of pixels.

DESCRIPTION OF THE EMBODIMENTS

The configuration disclosed in Japanese Patent Laid-Open No. 2010-56345 can cause signal charges generated in a deep region of the semiconductor substrate not to move to a region where the signal charges are to be collected, reducing the sensitivity to light.

The following disclosure relates to a technique for enhancing the sensitivity to light in a photoelectric conversion apparatus including a semiconductor region with high electrical resistivity under the semiconductor region where signal charges are to be accumulated.

Photoelectric conversion apparatus according to embodiments will be described hereinbelow with reference to the drawings. The conductivity types of the transistors described in the embodiments are given merely for illustrative purposes and are not seen to limit the scope of the present disclosure. The conductivity types described in the embodiments may be changed as appropriate, and the electric potentials of the gate, the source, and the drain of each transistor may be changed as appropriate. For example, in the case of a transistor that is operated as a switch, the low level and the high level of the electric potential applied to the gate may be reversed from the description of the embodiments with a change in conductivity type. The conductivity types of the semiconductor regions described in the embodiments are also given merely for illustrative purposes and are not seen to limit the scope of the present disclosure. The conductivity types described in the embodiments may be changed as appropriate, and the electric potentials of the semiconductor regions may be changed as appropriate with a change in conductivity type.

First Embodiment

Figure 1:
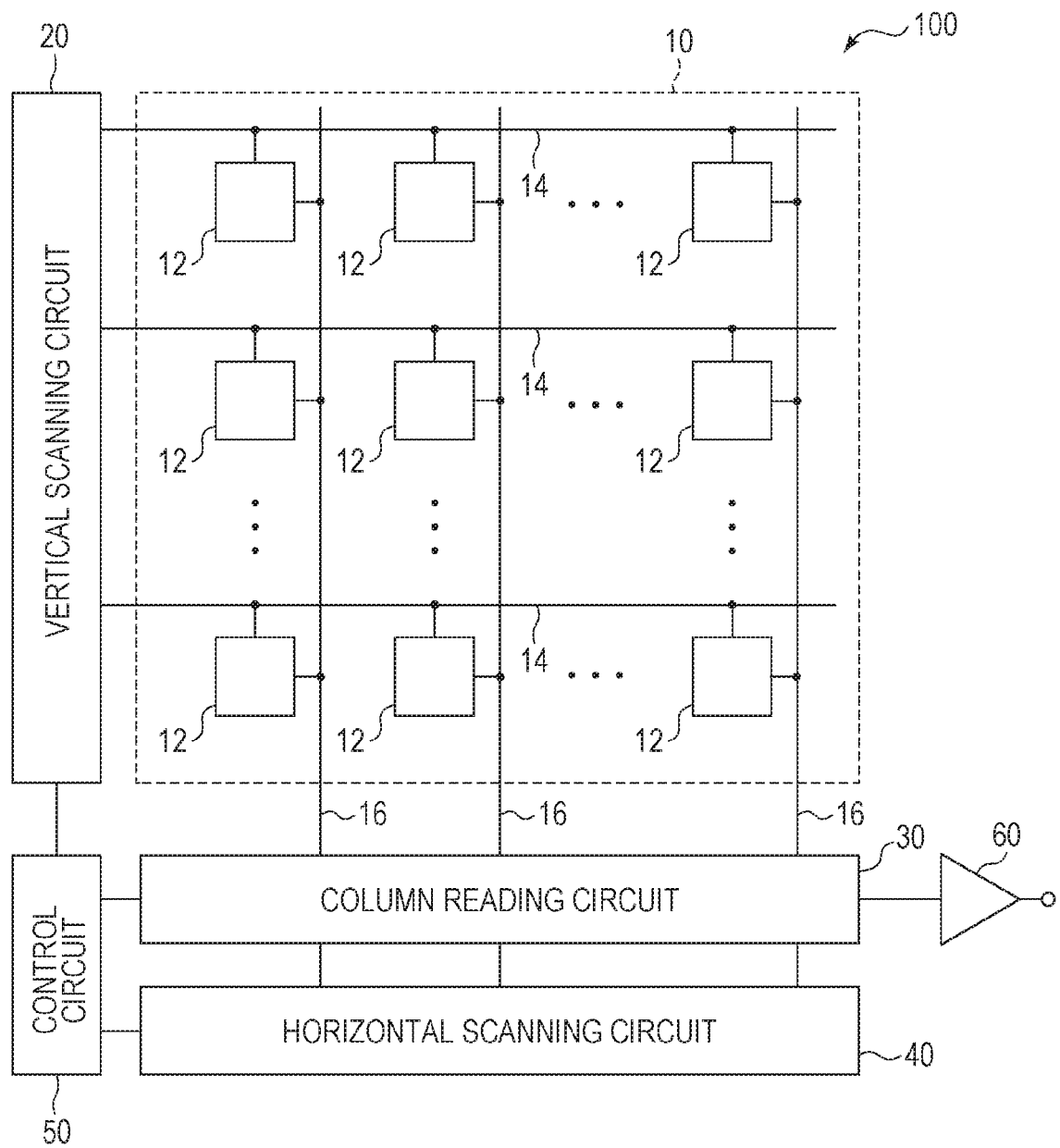
FIG. 1 is a block diagram illustrating the configuration of a photoelectric-conversion apparatus.
Figure 2:
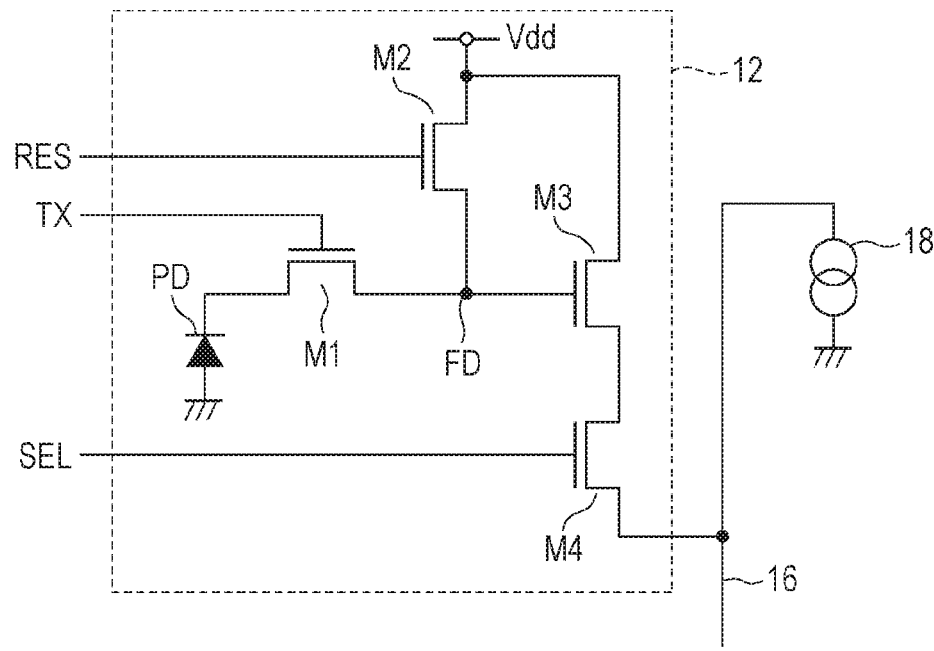
FIG. 2 is a diagram illustrating the configuration of a pixel.
Figure 3:
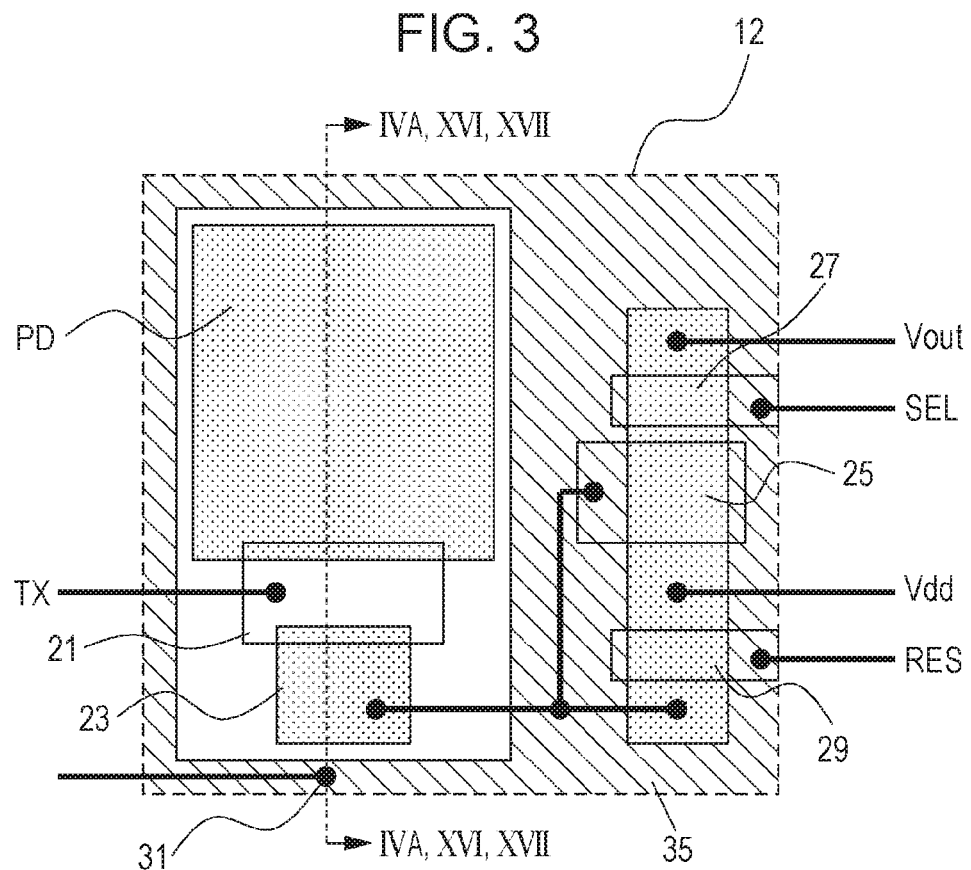
FIG. 3 is a top view of the pixel.
Figure 4A:
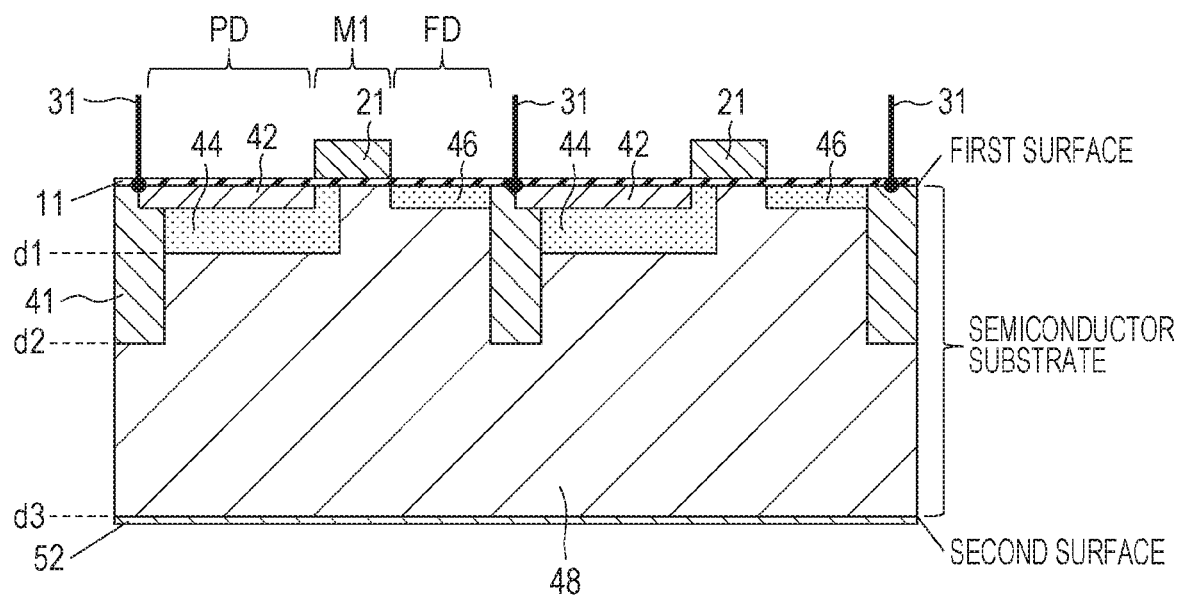
FIGS. 4A and 4B are cross-sectional views of pixels.
Figure 4B:
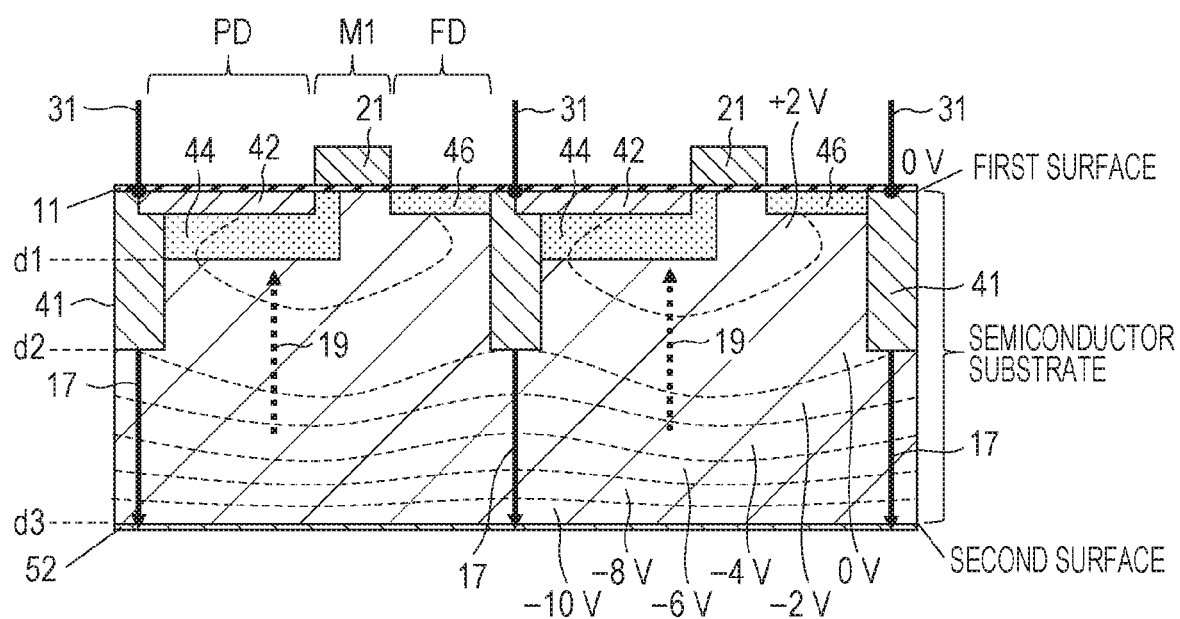

FIG. 1 is a block diagram illustrating, in outline, the configuration of a solid-state image capturing apparatus according to the present embodiment, which is an example of a photoelectric conversion apparatus. FIG. 2 is an equivalent circuit schematic of a pixel of the solid-state image capturing apparatus according to the present embodiment. FIG. 3 is a diagram of a pixel of the solid-state image capturing apparatus according to the present embodiment illustrating the planar layout thereof. FIGS. 4A and 4B are schematic cross-sectional views of pixels of the solid-state image capturing apparatus according to the present embodiment. FIGS. 5A to 5C are cross-sectional views of pixels of a solid-state image capturing apparatus of a comparative example of the present embodiment.

As illustrated in FIG. 1, a solid-state image capturing apparatus 100 of the present embodiment includes a pixel region 10, a vertical scanning circuit 20, a column reading circuit 30, a horizontal scanning circuit 40, a control circuit 50, and an output circuit 60.

The pixel region 10 includes a plurality of pixels 12 arrayed in rows and columns in a matrix pattern. A control signal line 14 extending in the row direction (in the lateral direction in FIG. 1) is disposed for each row of the pixel array of the pixel region 10. The control signal line 14 is connected to the pixels 12 arranged in the row direction to form a signal line common to these pixels 12. A vertical output line 16 extending in the column direction (in the vertical direction in FIG. 1) is disposed for each column of the pixel array of the pixel region 10. The vertical output line 16 is connected to the pixels 12 arranged in the column direction to form a signal line common to these pixels 12.

The control signal line 14 of each row is connected to the vertical scanning circuit 20. The vertical scanning circuit 20 is a circuit unit that supplies a control signal for driving a readout circuit in each pixel 12 to the pixel 12 through the control signal line 14 in reading a pixel signal from the pixel 12. One end of the vertical output line 16 of each column is connected to the column reading circuit 30. The pixel signal read from the pixel 12 is input to the column reading circuit 30 through the vertical output line 16. The column reading circuit 30 is a circuit unit that performs predetermined signal processing, for example, amplification processing or analog-to-digital (AD) conversion processing, on the pixel signal read from the pixel 12. The column reading circuit 30 can include a differential amplifier circuit, a sample and hold circuit, and an AD conversion circuit.

The horizontal scanning circuit 40 is a circuit unit that supplies control signals for transferring the pixel signals processed in the column reading circuit 30 to the output circuit 60 in sequence to the column reading circuit 30. The control circuit 50 is a circuit unit for supplying control signals for controlling the operations and their timings of the vertical scanning circuit 20, the column reading circuit 30, and the horizontal scanning circuit 40. The output circuit 60 is a circuit unit including a buffer amplifier and a differential amplifier and used to output pixel signals read from the column reading circuit 30 to a signal processing device outside the solid-state image capturing apparatus 100.

As illustrated in FIG. 2, each pixel 12 includes a photoelectric conversion unit PD, a transfer transistor M1, a reset transistor M2, an amplifying transistor M3, and a selection transistor M4. An example of the photoelectric conversion unit PD is a photodiode, whose anode is connected to a ground voltage line and whose cathode is connected to the source of the transfer transistor M1. The drain of the transfer transistor M1 is connected to the source of the reset transistor M2 and the gate of the amplifying transistor M3. The connection node of the drain of the transfer transistor M1, the source of the reset transistor M2, and the gate of the amplifying transistor M3 is a what-is-called floating diffusion (FD) and constitutes a charge-voltage conversion unit composed of the capacitive component of the node. The drain of the reset transistor M2 and the drain of the amplifying transistor M3 are connected to a source voltage line (Vdd). The source of the amplifying transistor M3 is connected to the drain of the selection transistor M4. The source of the selection transistor M4 is connected to the vertical output line 16. The other end of the vertical output line 16A is connected to a current source 18.

In the circuit configuration illustrated in FIG. 2, the control signal line 14 includes a transfer-gate signal line TX, a reset signal line RES, and a selection signal line SEL. The transfer-gate signal line TX is connected to the gate of the transfer transistor M1. The reset signal line RES is connected to the gate of the reset transistor M2. The selection signal line SEL is connected to the gate of the selection transistor M4.

The photoelectric conversion unit PD converts incident light to an amount of charges corresponding to the amount of the light (photoelectric conversion) and accumulates the generated charges. Upon being turned on, the transfer transistor M1 transfers the charges of the photoelectric conversion unit PD to the floating diffusion FD. The floating diffusion FD goes to a voltage corresponding to the amount of charges transferred from the photoelectric conversion unit PD by charge-to-voltage conversion according to its capacitance. The amplifying transistor M3 constitutes an amplifier (source follower circuit) with a configuration in which the drain is supplied with a power supply voltage Vdd, the source is supplied with a bias current from the current source 18 via the selection transistor M4, and the gate serves as an input node. Thus, the amplifying transistor M3 outputs a signal based on the voltage of the floating diffusion PD to the vertical output line 16 via the selection transistor M4. Upon being turned on, the reset transistor M2 resets the floating diffusion FD to a voltage according to the power supply voltage Vdd.

FIG. 3 is a schematic diagram of the pixel 12 of the present embodiment illustrating a planar layout viewed from the top (incident plane). In FIG. 3, the same components as those illustrated in FIGS. 1 and 2 are denoted by the same reference signs as the signs illustrated in FIGS. 1 and 2. A front electrode 31 is an electrode used to apply an electric potential to a P-type isolation region 35. The P-type isolation region 35 is disposed around the outer periphery of the photoelectric conversion unit PD.

A transfer gate 21 is provided as part of the transfer transistor M1 that transfers the charges of the photoelectric conversion unit PD. The transfer gate 21 is disposed between a floating diffusion region 23, which is part of the floating diffusion (FD), and the photoelectric conversion unit PD. The transfer gate 21 is connected to the transfer-gate signal line TX.

The floating diffusion region 23 is connected to an amplifying gate 25, which is the gate of the amplifying transistor M3, through a PD connecting line. A selection gate 27, which is the gate of the selection transistor M4, is connected to a selection signal line SEL. One of the source and the drain of the selection transistor M4 is connected to a signal line vout which is a vertical output line 16. The other of the source and the drain of the selection transistor M4 also serves as the source of the amplifying transistor M3. The drain of the amplifying transistor M3 receives the power supply voltage Vdd.

A reset gate 29, which is the gate of the reset transistor M2, is connected to a reset signal line RES. The drain of the reset transistor M2 also serves as the drain of the amplifying transistor M3. The source of the reset transistor M2 is connected to the floating diffusion region 23 and the amplifying gate 25 through the FD connecting line.

FIG. 4A is a cross-sectional view of two pixels taken along line IVA-IVA of FIG. 3. In FIG. 4A, the same components as those of FIGS. 1 to 3 are denoted by the same reference signs as the signs in FIGS. 1 to 3. A gate insulator film 11 is provided on a first surface of the semiconductor substrate. The gate insulator film 11 is typically composed of silicon oxide.

The photoelectric conversion unit PD includes a P-type semiconductor region 42 and an N-type semiconductor region 44. The N-type semiconductor region 44 is a charge accumulation region where electric charges generated by photoelectric conversion (in the present embodiment, electrons) are accumulated. A P-type semiconductor region 48 is provided under the N-type semiconductor region 44.

The P-type semiconductor region 42 is provided in contact with the first surface. The P-type semiconductor region 42 suppresses the inflow of charges generated due to a dark current generated on the surface of the semiconductor substrate into the N-type semiconductor region 44.

An N-type semiconductor region 46 serves as the floating diffusion region 23 illustrated in FIG. 3.

In FIG. 3, the P-type isolation region 35 disposed around the outer periphery of the photoelectric conversion unit PD is a P-type isolation region 41 in FIG. 4A. The P-type isolation region 41 is connected to the front electrode 31.

A back electrode 52 is provided under a second surface of the semiconductor substrate. The back electrode 52 is in contact with the P-type semiconductor region 48. The back electrode 52 is disposed across the plurality of pixels 12. Typically, the back electrode 52 is disposed across the pixel region 10 illustrated in FIG. 1. However, this example is given merely for illustrative purposes. The back electrode 52 may be segmented for each pixel row. The back electrode 52 may be segmented for each pixel column. The back electrode 52 may also be segmented for each block including multiple rows and columns of pixels 12.

The N-type semiconductor region 44 (bottom) is disposed at a depth d1 from the first surface of the semiconductor substrate. The depth of a semiconductor region is defined as the distance from the first face to the second face of that semiconductor region. A depth is deeper than another depth when its distance is longer than the distance of the other depth. Similarly, a depth is shallower than another depth when its distance is shorter than the distance of the other depth. The P-type semiconductor region 48 (bottom) is disposed at a depth d3 deeper than the depth d1. The P-type isolation region 41 is disposed so as to extend at least from the first depth d1 to a depth d2 shallower than the depth d3 in the depth direction.

The front electrode 31 receives a lower potential for the electrons serving as the carrier of the N-type semiconductor region 44. In the present embodiment, the electric potential of the front electrode 31 is set at 0 V, and the electric potential of the back electrode 52 is set at −10 V.

In the present embodiment, the impurity concentration of the P-type semiconductor region 48 is lower than the impurity concentration of the P-type semiconductor region 42. In the present embodiment, the impurity concentration of the P-type semiconductor region 48 is set at $1 \times 10^{11}$ [atom/cm$^3$]. This example is not intended to limit the present disclosure. In some embodiments, the impurity concentration is lower than or equal to $1 \times 10^{12}$ [atom/cm$^3$]. The impurity concentration of the P-type semiconductor region 48 is preferably $1 \times 10^9$ [atom/cm$^3$] or more to provide the function of the P-type semiconductor. In the present embodiment, the electrical resistivity of the P-type semiconductor region 48 is set to a high electrical resistivity of 3,000 [Ω·cm] or more. This may reduce or eliminate hole current flowing through the P-type semiconductor region 48, forming a desirable electric potential gradient in the substrate depth direction in the P-type semiconductor region 48. The electrical resistivity of the P-type semiconductor region 48 is preferably 300,000 [Ω·cm] or less corresponding to the lower limit impurity concentration at which the P-type semiconductor region 48 functions as a P-type semiconductor region.

The impurity concentration of the P-type semiconductor region 42 is set at $2 \times 10^{19}$ [atom/cm$^3$]. In this specification, the impurity concentration is the concentration of impurities present in the semiconductor region.

FIG. 4B is a schematic diagram illustrating equipotential lines for illustrating an electric potential distribution in the configuration of FIG. 4A.

The front electrode 31 and the back electrode 52 are conducting through the P-type isolation region 41 and the P-type semiconductor region 48, allowing a hole current 17 to flow therethrough. However, the P-type semiconductor region 48 has an the impurity concentration of $1 \times 10^{11}$ [atom/cm$^3$], as described above. For this reason, the electrical resistance between the front electrode 31 and the back electrode 52 is high, causing an electric potential gradient in the P-type semiconductor region 48. The electric potential gradient makes it easy for electrons 19 generated in the P-type semiconductor region 48 by the photoelectric conversion of incident light to move to the N-type semiconductor region 44. Thus, the increase in electrons 19 collected to the N-type semiconductor region 44 enhances the sensitivity of the photoelectric conversion apparatus.

The N-type semiconductor region 44, the P-type semiconductor region 48, and the P-type semiconductor region 42 form a depletion layer.

The P-type isolation region 41 may extend to a position deeper than the N-type semiconductor region 44. The P-type isolation region 41 may extend to a portion deeper than the depletion layer formed by the N-type semiconductor region 44, the P-type semiconductor region 48, and the P-type semiconductor region 42.

The reason will be described with reference to FIGS. 5A to 5C.

FIG. 5A illustrates a configuration in which a P-type isolation region 53 extends to the depth d1 which is the same as the depth of the bottom of an N-type semiconductor region 56. The P-type isolation region 53 receive a voltage of 0 V through the front electrode 31, as in FIG. 4A. The N-type semiconductor region 56 is a charge accumulation layer, which is disposed under a P-type semiconductor region 54. An N-type semiconductor region 62 is the floating diffusion region 23. The back electrode 52 receives a voltage of −10 V applied.

FIG. 5B is a schematic diagram illustrating equipotential lines for illustrating an electric potential distribution in the configuration of FIG. 5A. In the configuration of FIG. 5A, the P-type isolation region 53 extends only to the depth d1, causing the depletion layers 55 of the adjacent pixels to connect to each other, as illustrated in FIG. 5B.

A electric potential distribution in this case is illustrated in FIG. 5C. The depletion layers 55 are high resistance regions where the hole current 17 between the P-type isolation region 53 and the back electrode 52 does not flow easily. For this reason, the P-type semiconductor region 48 in FIG. 5C has electric potential gradients concentrated around the depth d1, although the P-type semiconductor region 48 in FIG. 4B has electric potential gradients in the area from the depth d2 to the depth d3. Thus, the electric potential gradient in the area between the depth d2 and the depth d3 is small. This decreases the driving force for moving the electrons generated in the P-type semiconductor region 48 to the N-type semiconductor region 56. This causes electrons generated in the P-type semiconductor region 48 of one pixel to be collected in the N-type semiconductor region 56 of another pixel, so-called crosstalk.

To overcome this demerit, the P-type isolation region 41 of the photoelectric conversion apparatus of the present embodiment extends to a position deeper than the N-type semiconductor region 44, as illustrated in FIG. 4A. This makes it easy for the electrons 18 generated in the P-type semiconductor region 48 to move to the N-type semiconductor region 44, as described above. This increases electrons 18 collected in the N-type semiconductor region 44, improving the sensitivity of the photoelectric conversion apparatus.

The impurity concentration of the P-type isolation region 41 may be higher than the impurity concentration of at least the P-type semiconductor region 48. The increase in the impurity concentration of the P-type isolation region 41 decreases the electrical resistance to the hole current. This may also suppress depletion of the P-type isolation region 41 due to the electric potential difference from the N-type semiconductor region 44.

The electric potential difference in the P-type isolation region 41 may be smaller than the electric potential difference in the P-type semiconductor region 48. This allows most of the electric potential difference between the front electrode 31 and the back electrode 52 to be formed in forming electric potential gradients in the P-type semiconductor region 48, further reducing crosstalk.

Second Embodiment

The present embodiment will be described with a focus on differences from the first embodiment. In the present embodiment, the photoelectric conversion unit PD includes a P-type semiconductor region PDS with a higher impurity concentration than the impurity concentration of the P-type semiconductor region 48 under the N-type semiconductor region 44 where signal charges are to be accumulated. This makes the capacitance of the depletion layer generated between the N-type semiconductor region 44 and the P-type semiconductor region PDS disposed thereunder larger than the capacitance of the first embodiment. Thus, the saturation charge amount of the photoelectric conversion unit PD is increased from the first embodiment.

Figure 6:
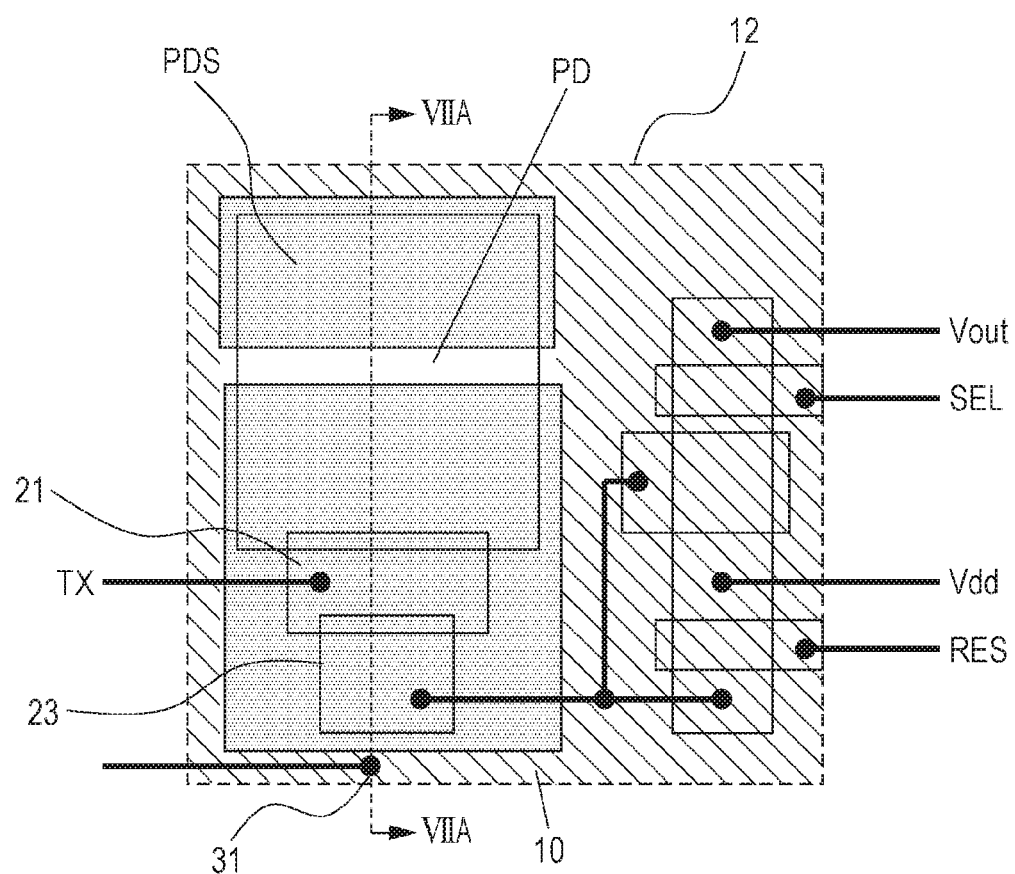
FIG. 6 is a top view of a pixel.

In the present embodiment, the P-type semiconductor region PDS is provided at a position overlapping with the photoelectric conversion unit PD in plan view, as illustrated in FIG. 6. The P-type semiconductor region PDS has a higher impurity concentration than the impurity concentration of the P-type semiconductor region 48.

Figure 7A:
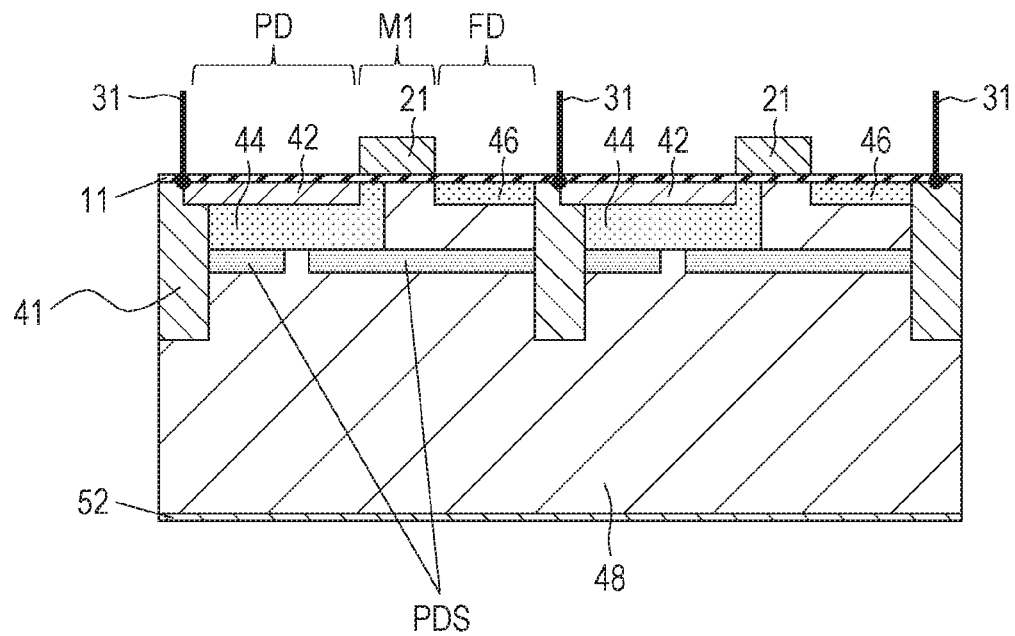
FIGS. 7A and 7B are cross-sectional views of pixels.

FIG. 7A is a cross-sectional view of a region taken along line VIIA-VIIA in FIG. 6. The P-type semiconductor region PDS is disposed under the N-type semiconductor region 44 so as to be in contact with the bottom of the N-type semiconductor region 44. Therefore, the N-type semiconductor region 44 and the P-type semiconductor region PDS form a PN junction.

The depletion layer generated between the N-type semiconductor region 44 and the P-type semiconductor region PDS less expands than the depletion layer generated between the N-type semiconductor region 44 and the P-type semiconductor region 48 in the first embodiment. As a result, the capacitance of the depletion layer generated in the present embodiment is larger than the capacitance of the depletion layer generated in the first embodiment. Thus, the saturation charge amount of the photoelectric conversion unit PD is larger than the saturation charge amount of the first embodiment.

Figure 7B:
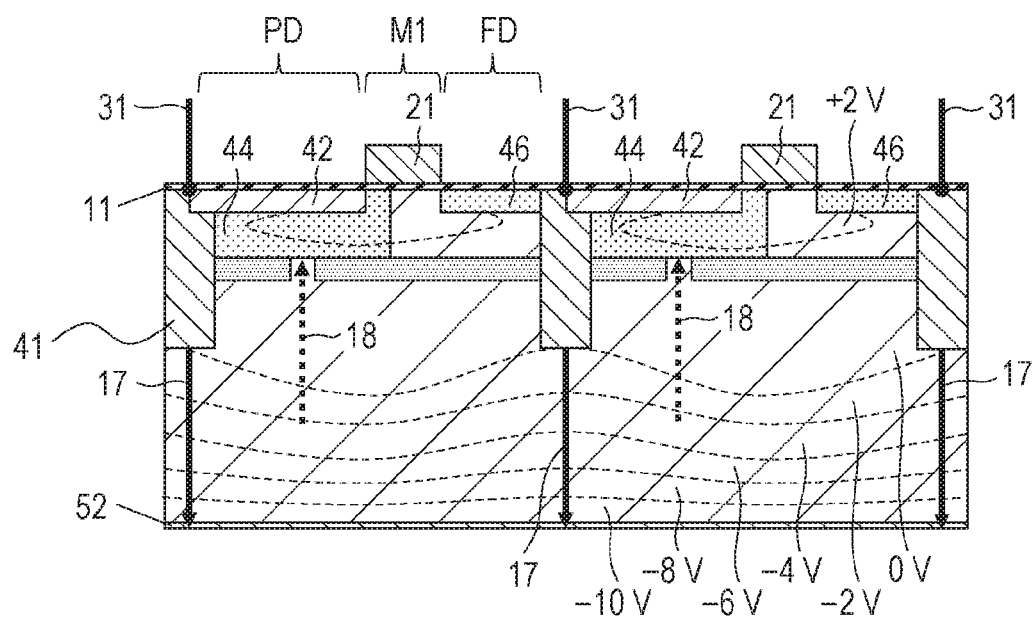

In the present embodiment, the P-type semiconductor region PDS has slits so as to be divided, as illustrated in FIG. 6 and FIG. 7A. The signal charges (electrons) 18 generated in the P-type semiconductor region 48 move to the N-type semiconductor region 44 through the slits of the P-type semiconductor region PDS, as illustrated in FIG. 7B. The slits make it easy for the signal charges (electrons) 18 generated in the P-type semiconductor region 48 to move to the N-type semiconductor region 44. This may improve the sensitivity to light with a wavelength that generates signal charges in the P-type semiconductor region 48 (typically, near infrared light and infrared light).

Thus, in the photoelectric conversion apparatus of the present embodiment, the P-type semiconductor region PDS with a higher impurity concentration than the impurity concentration of the P-type semiconductor region 48 and the N-type semiconductor region 44 are joined together to form a PN junction. This increases the saturation charge amount of the photoelectric conversion unit PD. The slits in P-type semiconductor region PDS improve the sensitivity of the photoelectric conversion unit PD.

Third Embodiment

A photoelectric conversion apparatus of the present embodiment will be described with a focus on differences from the first embodiment.

FIG. 8 is a cross-sectional view of pixels of the photoelectric conversion apparatus of the present embodiment. The layout seen from the top may be the same as the layout of the first embodiment.

The present embodiment is a what-is-called front-illuminated photoelectric conversion apparatus that receives light from the first surface of the semiconductor substrate.

The photoelectric conversion apparatus of the present embodiment includes a reflection member 63 under the second surface of the semiconductor substrate. The reflection member 63 may be typically made of metal, such as aluminum, silver, or copper. The use of the reflection member 63 allows light passing through the P-type semiconductor region 48 to be reflected into the P-type semiconductor region 48. This can further improve the sensitivity of the photoelectric conversion unit PD.

If the back electrode 52 is made of metal, such as aluminum or copper, the reflection member 63 can be omitted by using the back electrode 52 as a reflection member.

Fourth Embodiment

A photoelectric conversion apparatus of the present embodiment will be described with a focus on differences from the first embodiment.

FIG. 9 is a cross-sectional view of pixels of the photoelectric conversion apparatus of the present embodiment. The layout seen from the top may be the same as the layout of the first embodiment.

The present embodiment is a what-is-called back-illuminated photoelectric conversion apparatus that receives light from the second surface of the semiconductor substrate.

In the present embodiment, the back electrode 52 is a transparent electrode. The material of the transparent electrode may be indium oxide, tin oxide, titanium oxide, graphene, or a mixture thereof.

An antireflection film 64 is disposed under the back electrode 52 (light incident side). This suppresses reflection of incident light from the back electrode 52. This can improve the sensitivity of the photoelectric conversion unit PD.

The antireflection film 64 may be a single layer or a plurality of layers with different refractive indices.

Fifth Embodiment

A photoelectric conversion apparatus of the present embodiment will be described with a focus on differences from the first embodiment.

The photoelectric conversion apparatus of the present embodiment has a configuration in which one pixel includes one microlens and a plurality of photoelectric conversion units PD that receive light passing through the one microlens. The photoelectric conversion apparatus with this configuration can output signals for use in focus detection of a phase-difference detection method.

Figure 10A:
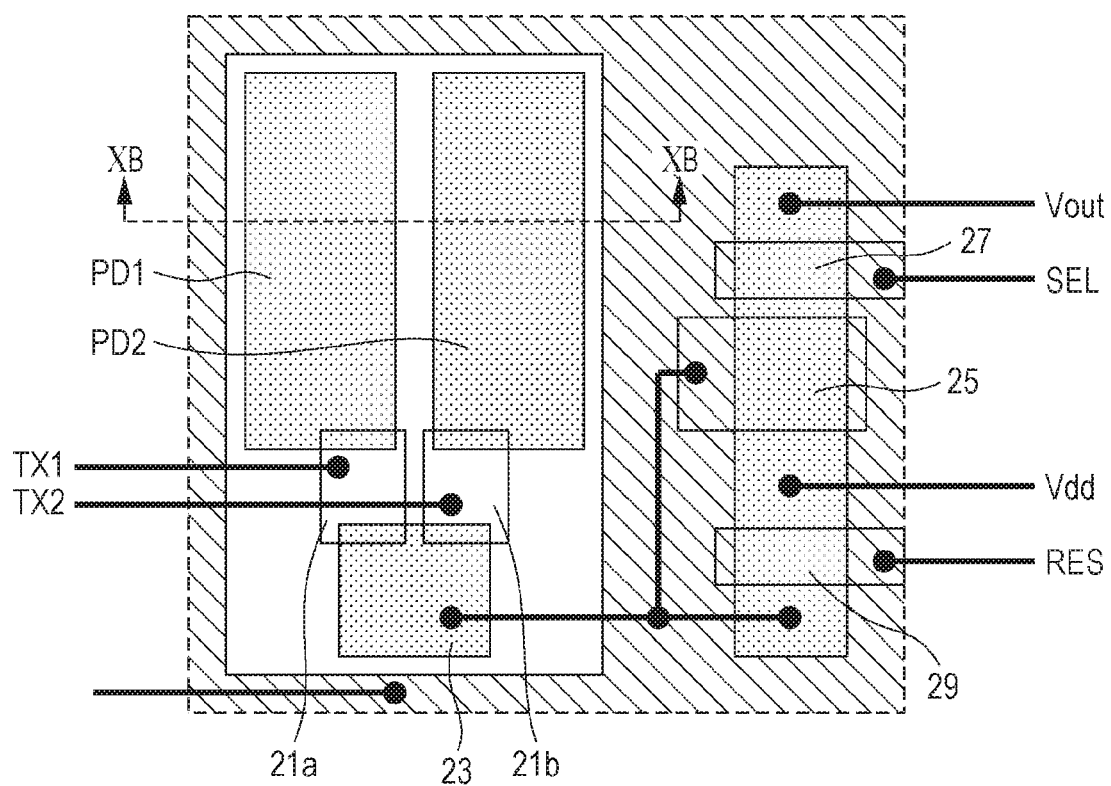
FIG. 10A is a top view of a pixel.

FIG. 10A is a top view of a pixel of the present embodiment. In FIG. 10A, components having the same functions as the functions of the components of the first embodiment described in FIG. 3 are denoted by the same reference signs as the signs of FIG. 3.

The pixels of the present embodiment each have a plurality of photoelectric conversion units PD1 and PD2. The pixel includes a transfer gate 21a corresponding to the photoelectric conversion unit PD1 and a transfer gate 21b corresponding to the photoelectric conversion unit PD2. The transfer gates 21a and 21b share the floating diffusion region 23. The transfer gate 21a is connected to a transfer-gate signal line TX1. The transfer gate 21b is connected to a transfer-gate signal line TX2.

Figure 10B:
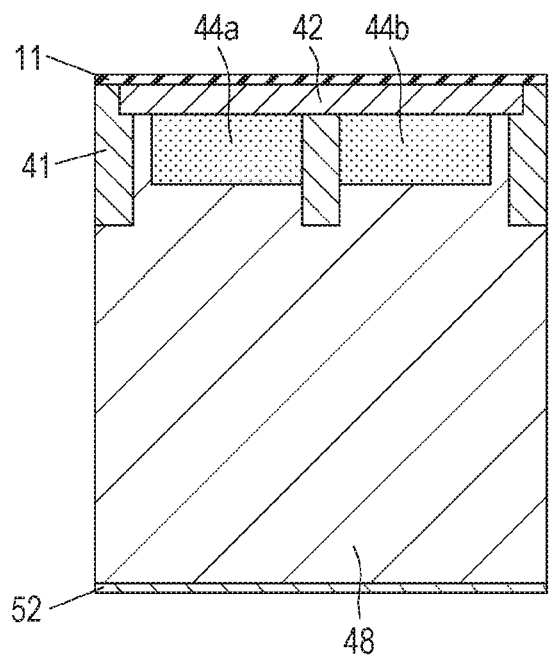
FIG. 10B is a cross-sectional view of the pixel.

The layout of the P-type isolation region 41 will be described. FIG. 10B is a cross-sectional view taken along line XB-XB in FIG. 10A. In the configuration of FIG. 10B, the P-type isolation region 41 is disposed at positions where the plurality of pixels are separated and a position where a region of the photoelectric conversion unit PD and a region of transistors are disposed are separated. The region of the transistors is a region in which an amplifying transistor, a reset transistor, and a selection transistor are disposed. The P-type isolation region 41 is not disposed between the photoelectric conversion unit PD1 and the photoelectric conversion unit PD2.

The configuration of FIGS. 10A and 10B may be used in the front-illuminated photoelectric conversion apparatus of the third embodiment. The configuration may also be used in a photoelectric conversion apparatus that uses photoelectric conversion of, for example, visible light with wavelengths shorter than the wavelengths of near infrared light. This is because the light with wavelengths in the visible light range is converted to electric signals in the vicinity of the surfaces of the photoelectric conversion units PD1 and PD2, and signal charges are accumulated in the respective N-type semiconductor regions 44a and 44b of the photoelectric conversion units PD1 and PD2 according to the incident positions.

Figure 11A:
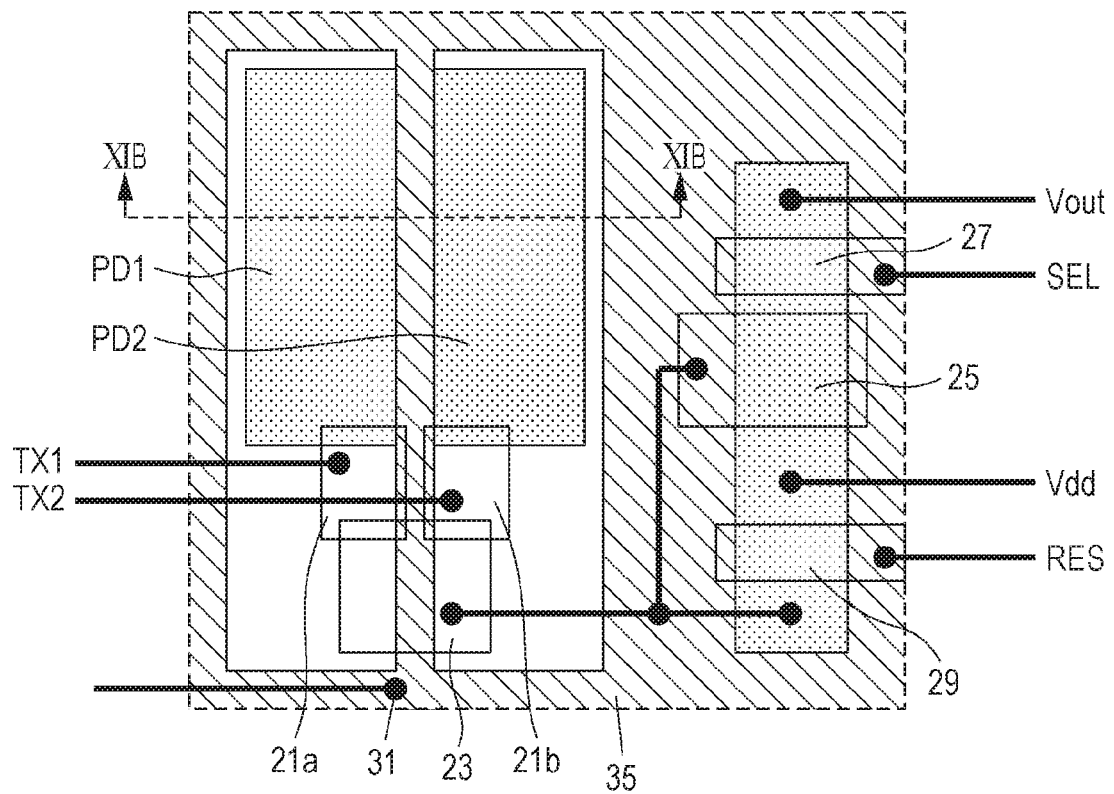
FIG. 11A is a top view of a pixel.
Figure 11B:
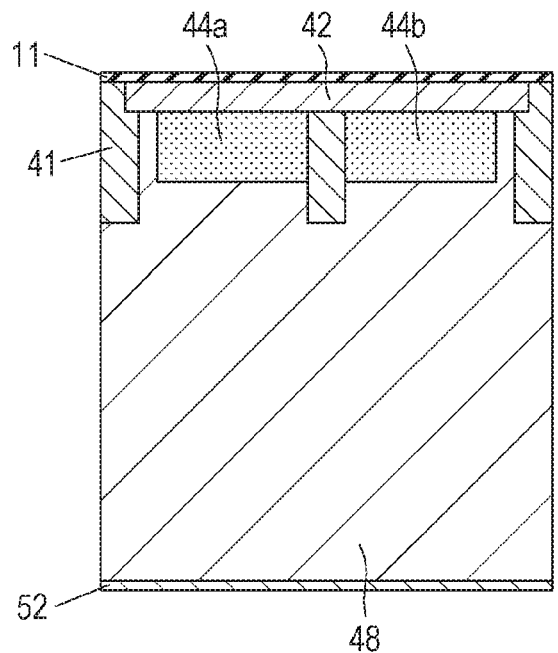
FIG. 11B is a cross-sectional view of the pixel.

FIGS. 11A and 11B are diagrams illustrating another layout of the P-type isolation regions 41. In FIGS. 11A and 11B, components having the same functions as the functions of the components described in FIGS. 10A and 10B are denoted by the same reference signs as the signs of FIGS. 10A and 10B.

In the configuration of FIGS. 11A and 11B, the P-type isolation region 41 is disposed between the photoelectric conversion unit PD1 and the photoelectric conversion unit PD2, in addition to the P-type isolation region 41 illustrated in FIGS. 10A and 10B. FIG. 11B is a cross-sectional view taken along XIB-XIB in FIG. 11A. The P-type isolation region 41 is disposed between the N-type semiconductor region 44a and the N-type semiconductor region 44b. In FIG. 11B, the P-type isolation region 41 extends from the bottom of the P-type semiconductor region 42 to a depth deeper than the bottoms of the N-type semiconductor regions 44a and 44b.

The configuration illustrated in FIGS. 11A and 11B may be used in both of front-illuminated and back-illuminated photoelectric conversion apparatuses. In both of the photoelectric conversion apparatuses, crosstalk between electric charges generated in and in the vicinity of the photoelectric conversion unit PD1 and electric charges generated in and in the vicinity of the photoelectric conversion unit PD2 can be reduced.

Figure 12A:
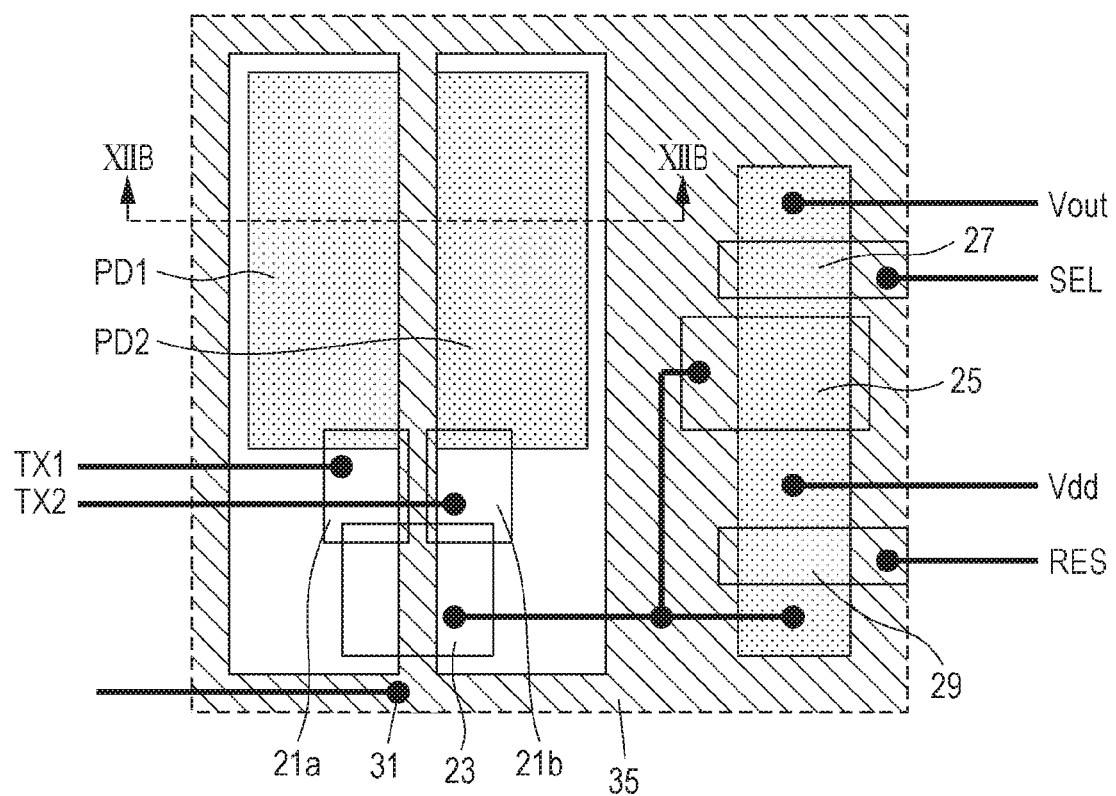
FIG. 12A is a top view of a pixel.
Figure 12B:
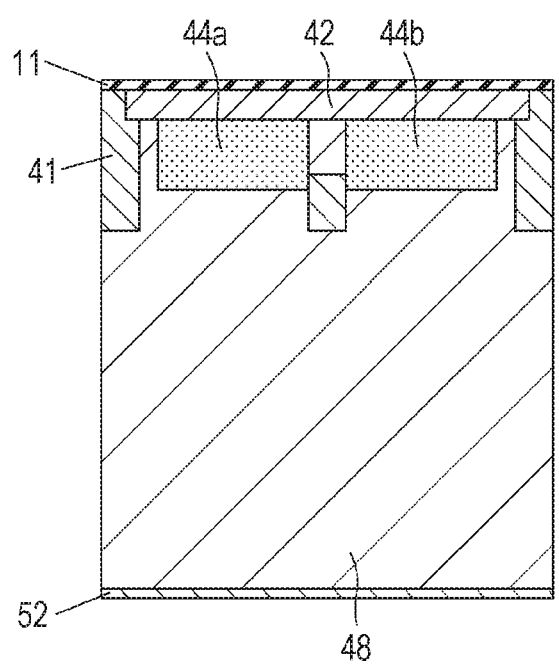
FIG. 12B is a cross-sectional view of the pixel.

In a configuration illustrated in FIGS. 12A and 12B, the P-type isolation region 41 is disposed between the photoelectric conversion unit PD1 and the photoelectric conversion unit PD2, in addition to the P-type isolation region 41 illustrated in FIGS. 10A and 10B, as in FIGS. 11A and 11B. FIG. 12B is a cross-sectional view taken along XIIB-XIIB in FIG. 12A. In FIG. 11B, the P-type isolation region 41 extends from the bottom of the P-type semiconductor region 42 to a depth deeper than the bottoms of the N-type semiconductor regions 44a and 44b. In FIG. 12B, the P-type isolation region 41 extends from a position deeper than the bottom of the P-type semiconductor region 42 to a depth deeper than the bottoms of the N-type semiconductor regions 44a and 44b.

The configuration illustrated in FIGS. 12A and 12B may be used in both of front-illuminated and back-illuminated photoelectric conversion apparatuses. In both of the photoelectric conversion apparatuses, if one of the photoelectric conversion units PD1 and PD2 is saturated, the signal charges overflow not to the photoelectric conversion unit PD1 or PD2 of another pixel but to another of the photoelectric conversion units PD1 and PD2 of the same pixel. In the case of pixels with color filters, adjacent pixels may have color filters of different colors. In this case, if the signal charge of one of the photoelectric conversion units PD1 and PD2 of one pixel overflows to one of the photoelectric conversion units PD1 and PD2 of another pixel, so-called color mixture occurs in which an image with a color ratio different from the original color ratio is generated. In the configuration illustrated in FIGS. 12A and 12B, signal charges cross the photoelectric conversion units PD1 and PD2 of the same pixel, as described above, to reduce or eliminate color mixture.

Figure 13A:
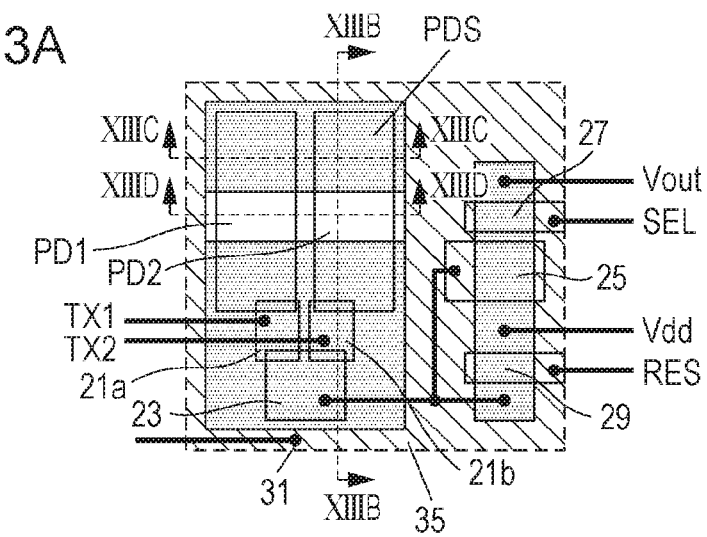
FIG. 13A is a top view of a pixel.
Figure 13B:
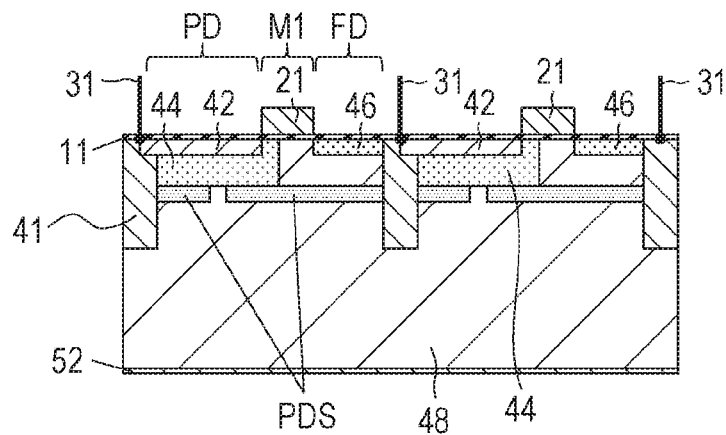
FIG. 13B to 13D are cross-sectional views of the pixel.
Figure 13C:
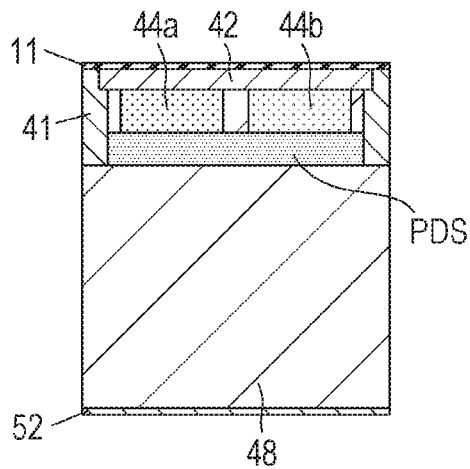
Figure 13D:
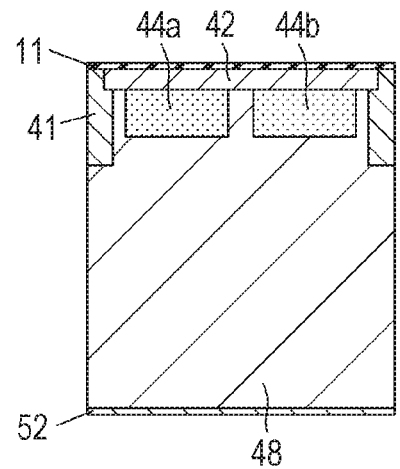

A configuration illustrated in FIGS. 13A to 13D is an application of the configuration of FIGS. 7A and 7B. FIG. 13B is a cross-sectional view taken along line XIIIB-XIIIB in FIG. 13A. FIG. 13C is a cross-sectional view taken along line XIIIC-XIIIC in FIG. 13A. FIG. 13D is a cross-sectional view taken along line XIIID-XIIID in FIG. 13A. The photoelectric conversion apparatus of the present embodiment also has the P-type semiconductor region PDS under the bottoms of the N-type semiconductor regions 44a and 44b. This can increase the saturation charges of the photoelectric conversion units PD1 and PD2.

Sixth Embodiment

A photoelectric conversion apparatus of the present embodiment will be described with a focus on differences from the first embodiment.

Figure 14A:
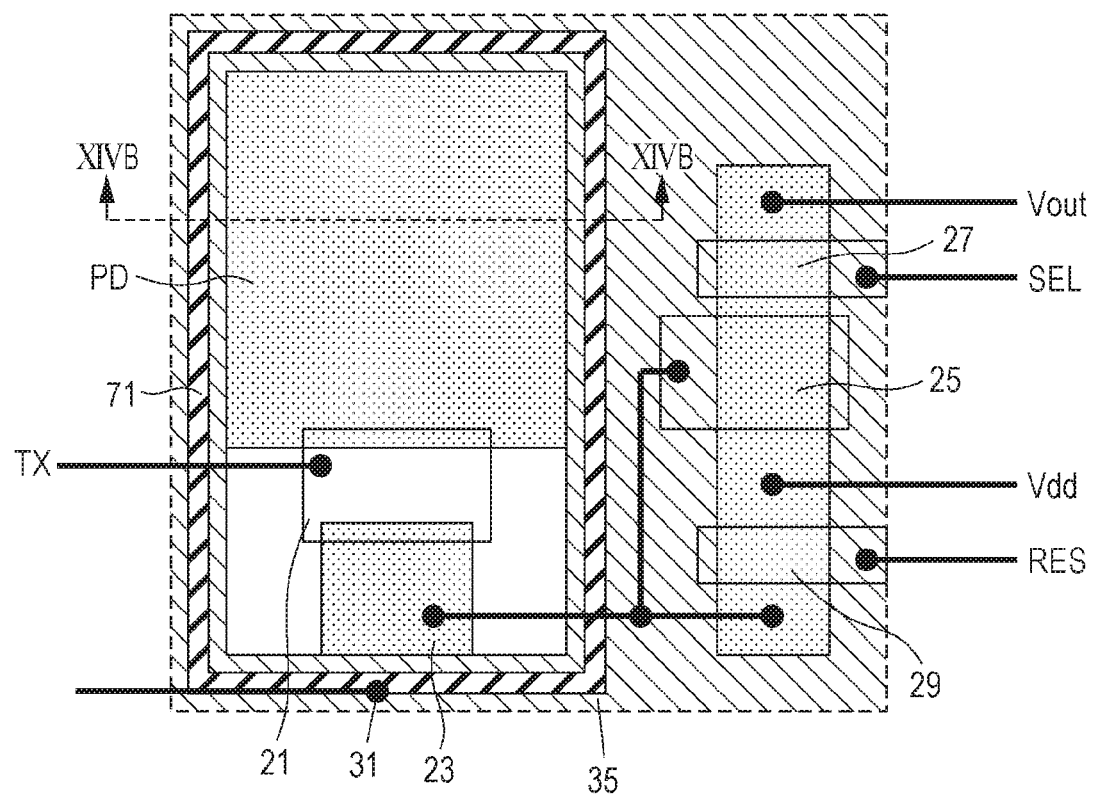
FIG. 14A is a top view of a pixel.
Figure 14B:
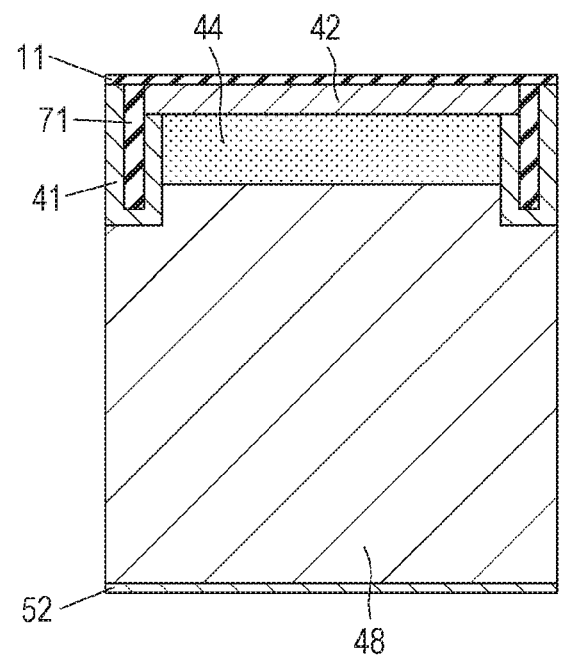
FIG. 14B is a cross-sectional view of the pixel.

FIGS. 14A and 14B are top views of a pixel of the photoelectric conversion apparatus of the present embodiment. In FIGS. 14A and 14B, components having the same functions as the functions of the components described in FIG. 3 are denoted by the same reference signs as the signs of FIG. 3.

The photoelectric conversion apparatus of the present embodiment includes an insulating member 71 in the P-type isolation region 41. The insulating member 71 may be made of silicon oxide, silicon nitride, silicon oxynitride, or the like.

The front electrode 31 is connected to the P-type isolation region 41.

The insulating member 71 is coated with the P-type isolation region 41. This can prevent dark current generated because of the insulating member 71 from flowing to the N-type semiconductor region 44.

Providing the insulating member 71 allows the width of the region isolating the pixels from each other to be smaller than the width in the first embodiment. This allows increasing the number of pixels of the pixel array and miniaturizing the pixels.

Seventh Embodiment

A photoelectric conversion apparatus of the present embodiment will be described with a focus on differences from the first embodiment.

In the present embodiment, the front electrode (a well contact 81) is shared by a plurality of pixels.

Figure 15:
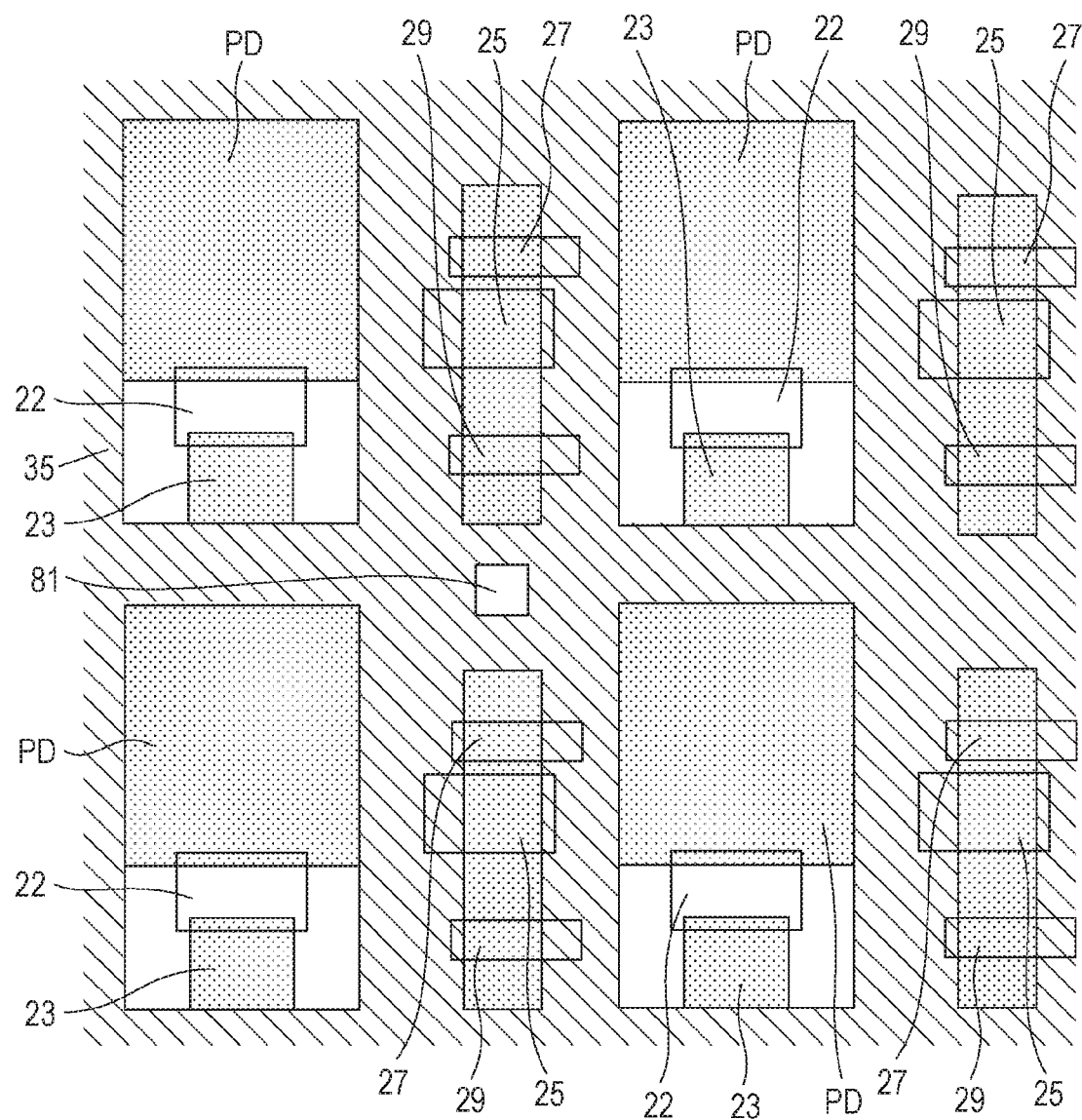
FIG. 15 is a top view of pixels.

FIG. 15 is a top view of the photoelectric conversion apparatus of the present embodiment. In FIG. 15, components having the same functions as the functions of the components described in FIG. 3 are denoted by the same reference signs as the signs of FIG. 3.

The well contact 81 that conducts electricity between the front electrode 31 and the P-type isolation region 41 is provided for each of a plurality of rows and columns of pixels. In the example of FIG. 15, one well contact 81 is provided for four pixels in two rows and two columns.

To decrease the electrical resistance between the back electrode 52 and the front electrode 31, the well contact 81 may be provided for each pixel. However, an increase in the number of well contacts 81 increases the pixel pitch, hindering increasing the number of pixels of the pixel array and miniaturizing the pixels. To suppress an increase in the pixel pitch, the area of the photoelectric conversion unit PD has to be small, which may decrease the sensitivity.

To increase the number of pixels in the pixel array and miniaturize the pixels, the well contact 81 may be shared by a plurality of pixels within a range that allows a decrease in electrical resistance between the back electrode 52 and the front electrode 31.

Thus, the photoelectric conversion apparatus of the present embodiment is easy to increase in the number of pixels of the pixel array and miniaturize the pixels by sharing the well contact 81 among a plurality of pixels. Furthermore, the configuration of the photoelectric conversion apparatus of the present embodiment can suppress a decrease in the area of the photoelectric conversion unit PD, reducing pre eliminating a decrease in sensitivity.

Eighth Embodiment

A photoelectric conversion apparatus of the present embodiment will be described with a focus on differences from the first embodiment.

The layout of the photoelectric conversion apparatus of the present embodiment seen from the top may be the same as the layout in FIG. 3.

Figure 16:
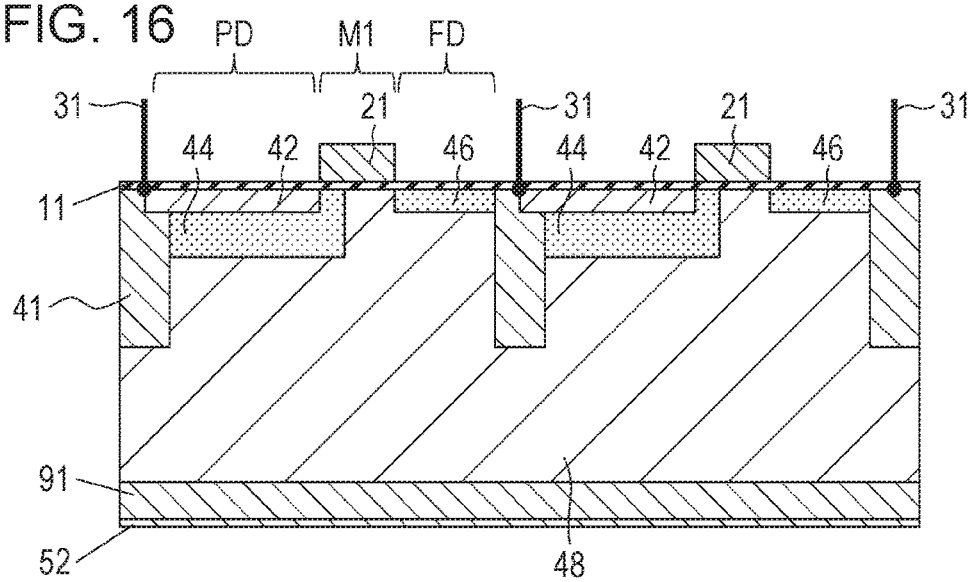
FIG. 16 is a cross-sectional view of pixels.

FIG. 16 is a cross-sectional view taken along line XVI-XVI in FIG. 3. In FIG. 16, components having the same functions as the functions of the components described in FIGS. 4A and 4B are denoted by the same reference signs as the signs of FIGS. 4A and 4B.

The present embodiment includes a P-type semiconductor region 91 on the back electrode 52. The P-type semiconductor region 91 has a higher impurity concentration than the P-type semiconductor region 48. Typically, the P-type semiconductor region 91 has an impurity concentration similar to the impurity concentration of the P-type isolation region 41.

In the configuration of FIG. 3, an electronic current due to electrons injected through the back electrode 52 flows between the P-type isolation region 41 and the back electrode 52 in response to a hole current flowing therethrough. The electrons due to the electronic current, if entering the N-type semiconductor region 44, cause noise. This noise is noticeable if the light incident on the photoelectric conversion unit PD is low (that is, low light).

In the present embodiment, the P-type semiconductor region 91 is disposed on the back electrode 52. This configuration allows the electrons injected through the back electrode 52 is offset by the holes of the P-type semiconductor region 91. This suppresses unnecessary injection of electrons into the N-type semiconductor region 44, thus reducing noise.

Thus, the photoelectric conversion apparatus of the present embodiment includes the P-type semiconductor region 91 on the back electrode 52 to suppress unnecessary injection of electric charges into the N-type semiconductor region 44 through the back electrode 52, thereby reducing noise.

Ninth Embodiment

A photoelectric conversion apparatus of the present embodiment will be described with a focus on differences from the first embodiment. The photoelectric conversion apparatus of the present embodiment forms electric potential gradients in the P-type semiconductor region 48 without using a back electrode.

Figure 17:
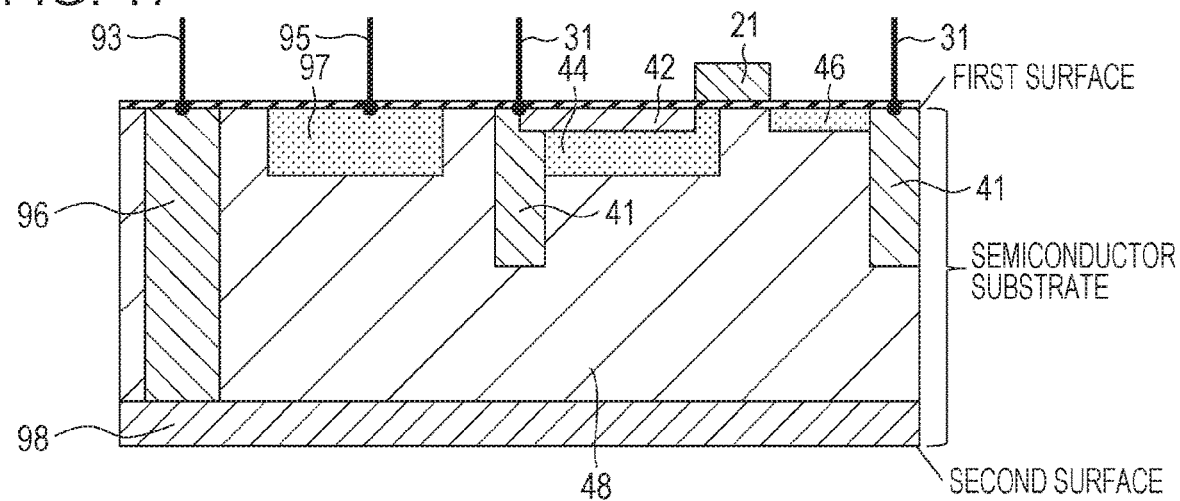
FIG. 17 is a cross-sectional view of pixels.

FIG. 17 is a cross-sectional view taken along line XVII-XVII in FIG. 3. In FIG. 17, components having the same functions as the functions of the components described in FIGS. 4A and 4B are denoted by the same reference signs as the signs of FIGS. 4A and 4B.

The present embodiment includes a P-type semiconductor region 98 under the bottom of the P-type semiconductor region 48. The impurity concentration of the P-type semiconductor region 98 is set higher than the impurity concentration of the P-type semiconductor region 48.

Typically, the P-type semiconductor region 98 is disposed along the second surface of the semiconductor substrate so as to be in contact with the second surface.

A P-type isolation region 96 extends from the first surface of the semiconductor substrate in the depth direction to the P-type semiconductor region 98. The P-type isolation region 96 and the P-type semiconductor region 98 may have similar impurity concentrations.

The P-type isolation region 96 is connected to a front electrode 93. The voltage applied through the front electrode 93 may be the same as the voltage applied by the back electrode 52 of the first embodiment.

This configuration includes an N-type semiconductor region 97 serving as a guardring to reduce the current flowing due to the voltage difference between the P-type isolation region 96 and the P-type isolation region 41. The N-type semiconductor region 97 receives a predetermined electric potential through a front electrode 95. Typically, the N-type semiconductor region 97 receives an intermediate electric potential between the electric potential of the P-type isolation region 96 and the electric potential of the P-type isolation region 41. This reduces the current to flow between the P-type isolation region 96 and the P-type isolation region 41.

Thus, the present embodiment can form the electric potential gradients in the P-type semiconductor region 48 without a back electrode. Furthermore, providing the guardring reduces the current to flow between the P-type isolation region 96 and the P-type isolation region 41.

Tenth Embodiment

A photoelectric conversion apparatus of the present embodiment will be described with a focus on differences from the first embodiment.

The photoelectric conversion apparatus of the present embodiment includes pixels for receiving visible light and pixels for receiving near infrared light and/or infrared light with longer wavelengths than the wavelengths of visible light.

Figure 18:
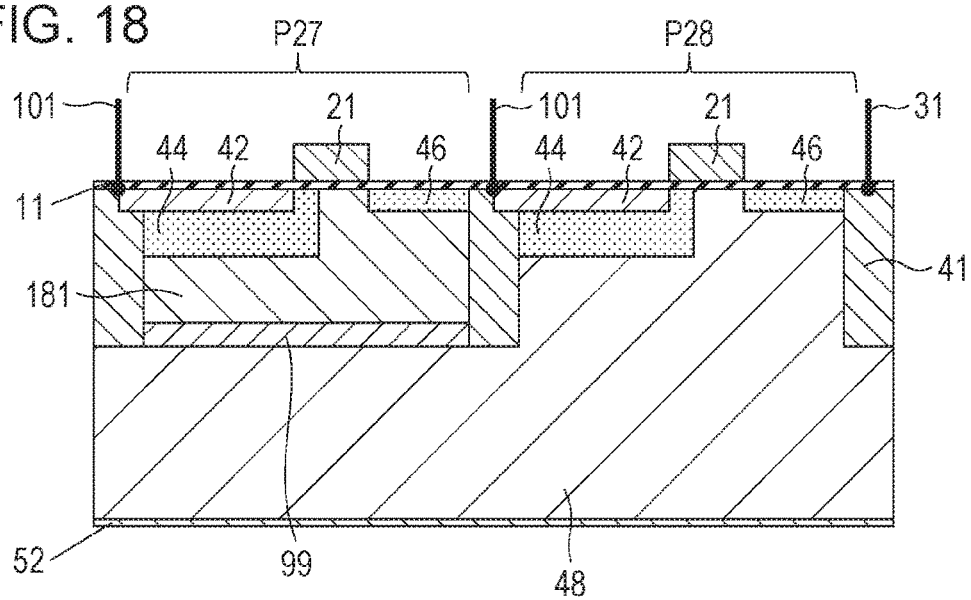
FIG. 18 is a cross-sectional view of pixels.

FIG. 18 is a cross-sectional view of the photoelectric conversion apparatus of the present embodiment. In FIG. 18, components having the same functions as the functions of the components described in FIGS. 4A and 4B are denoted by the same reference signs as the signs of FIGS. 4A and 4B.

A pixel P27 is a pixel for receiving visible light. A pixel P28 is a pixel for receiving light with longer wavelengths than the wavelengths of visible light.

The pixel P27 includes a P-type semiconductor region 181 under the bottom of the N-type semiconductor region 44. The impurity concentration of the P-type semiconductor region 181 may be similar to the impurity concentration of the P-type semiconductor region 41.

To electrically isolate the P-type semiconductor region 181 and the P-type semiconductor region 48 from each other, a P-type isolation region 99 is disposed so as to surround the P-type semiconductor region 181. The P-type isolation region 99 receives a predetermined electric potential through a front electrode 101.

The configuration of the pixel P28 may be the same as the configuration of the first embodiment.

Since the pixel P27 includes the P-type isolation region 99, electrons generated in the P-type semiconductor region 48 can be prevented from flowing into the N-type semiconductor region 44 of the pixel P27.

This suppresses flowing of signal charges based on light with longer wavelengths than the wavelengths of visible light into the pixel P27.

This improves the accuracy of signals of the pixel P27 that photoelectrically converts visible light, allowing the color ratio of the image to be closer to the color ratio of the subject.

Eleventh Embodiment

Figure 19:
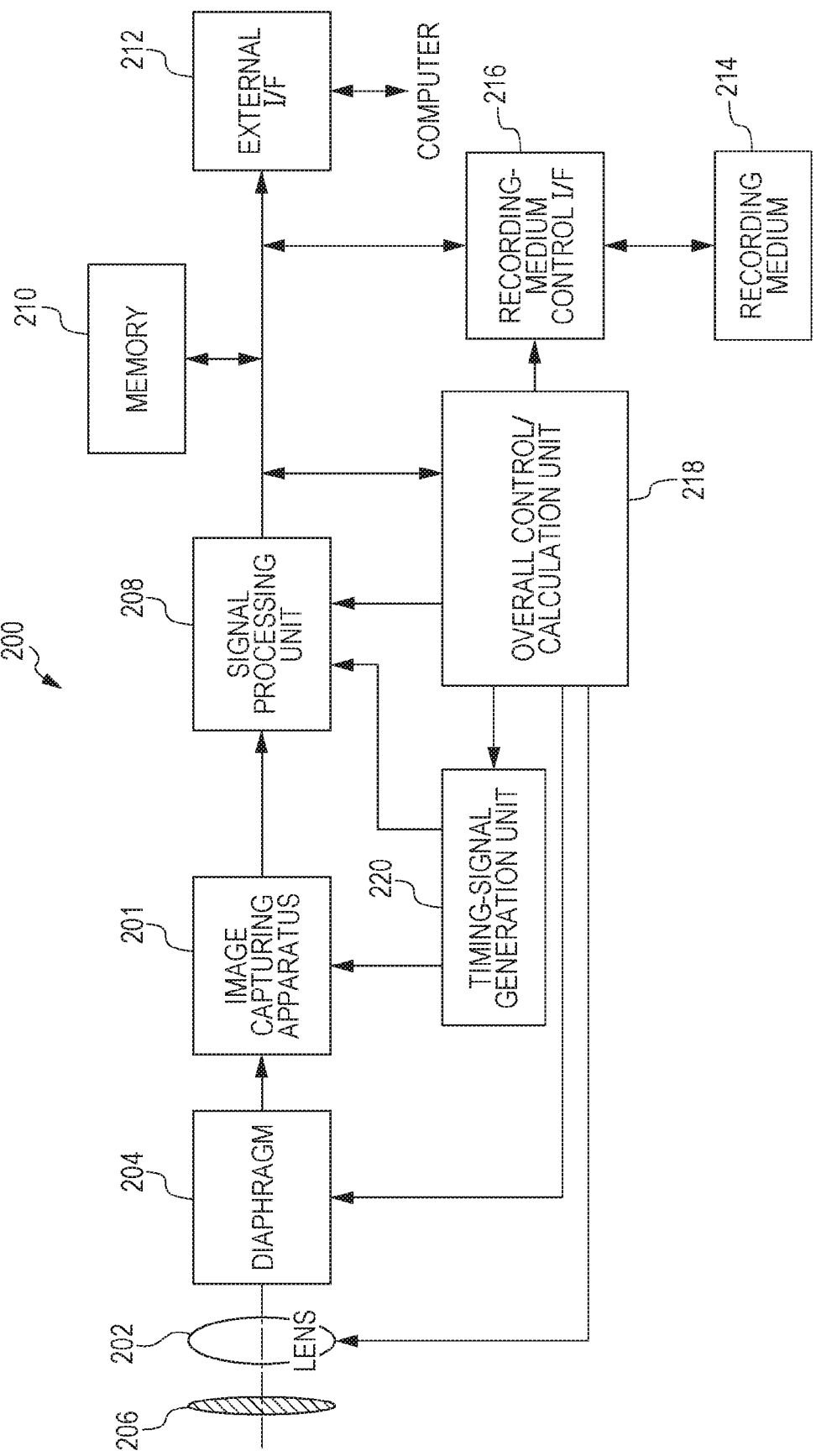
FIG. 19 is a block diagram illustrating the configuration of a photoelectric conversion system.

A photoelectric conversion system according to the present embodiment will be described with reference to FIG. 19. The same components as the components of the photoelectric conversion apparatuses of the above embodiments are denoted by the same reference signs, and descriptions will be omitted or simplified. FIG. 19 is a block diagram illustrating, in outline, the configuration of an image capturing system according to the present embodiment.

The photoelectric conversion apparatuses of the above embodiments may be used as an image capturing apparatus 201 of FIG. 19 to various image capturing systems. Examples of applicable photoelectric conversion systems include digital still cameras, digital camcorders, monitoring cameras, copy machines, facsimile machines, mobile phones, car-mounted cameras, and observation satellites. Another example of the photoelectric conversion system is a camera module including an optical system, such as a lens, and an image capturing apparatus. FIG. 19 illustrates a block diagram of a digital still camera by way of example.

An image capturing system will be described hereinbelow as an example of the photoelectric conversion system. An image capturing system 200 illustrated in FIG. 19 includes the image capturing apparatus 201, a lens 202 for forming an optical image of the subject on the image capturing apparatus 201, an aperture 204 for varying the amount of light passing through the lens 202, and a barrier 206 for protecting the lens 202. The lens 202 and the aperture 204 constitute an optical system that collects light to the image capturing apparatus 201.

The image capturing system 200 further includes a signal processing unit 208 that processes a signal output from the image capturing apparatus 201. The signal processing unit 208 performs analog-to-digital (AD) conversion for converting an analog signal output from the image capturing apparatus 201 to a digital signal. The signal processing unit 208 also performs various corrections and compressions as necessary and outputs image data. An AD conversion unit, which is part of the signal processing unit 208, may be disposed on a semiconductor substrate on which the image capturing apparatus 201 is disposed or on another semiconductor substrate separate from the image capturing apparatus 201. The image capturing apparatus 201 and the signal processing unit 208 may be disposed on the same semiconductor substrate.

The image capturing system 200 further includes a memory 210 for temporarily storing image data and an external interface (external I/F) 212 for communicating with an external computer or the like. The image capturing system 200 further includes a recording medium 214, such as a semiconductor memory, for recording or reading captured data and a recording-medium control interface (recording-medium control I/F) 216 for recording or reading captured data to or from the recording medium 214. The recording medium 214 may be provided in the image capturing system 200 or may be detachable.

The image capturing system 200 further includes an overall control/calculation unit 218 that performs various calculations and controls the entire digital still camera and a timing generation unit 220 that outputs various timing signals to the image capturing apparatus 201 and the signal processing unit 208. The timing signals may be input externally. The image capturing system 200 may include at least the image capturing apparatus 201 and the signal processing unit 208 that processes signals output from the image capturing apparatus 201.

The image capturing apparatus 201 outputs an image capture signal to the signal processing unit 208. The signal processing unit 208 performs predetermined signal processing on the image capture signal output from the image capturing apparatus 201 and outputs image data. The signal processing unit 208 generates an image using the image capture signal.

The use of the photoelectric conversion apparatuses according to the above embodiments as the image capturing apparatus 201 provides an image capturing system and a photoelectric conversion system capable of stably capturing high-quality images with high sensitivity and a large amount of saturation signals.

Twelfth Embodiment

Figure 20A:
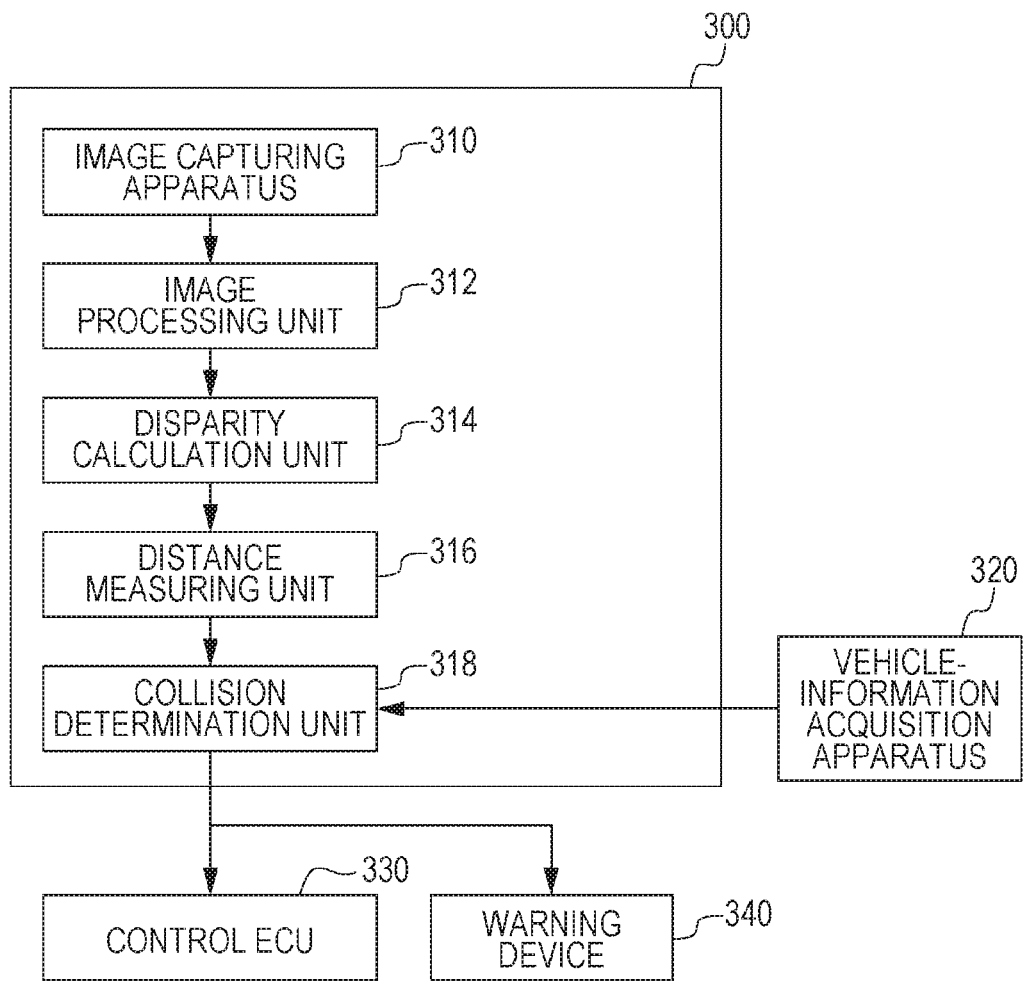
FIG. 20A is a block diagram illustrating an image capturing system.
Figure 20B:
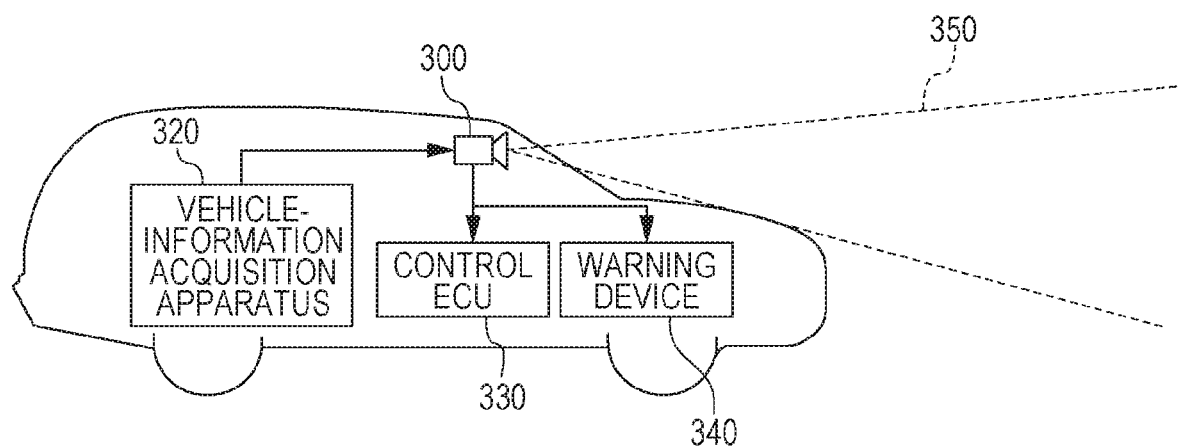
FIG. 20B is a block diagram illustrating a moving object.

A photoelectric conversion system and a moving object according to the present embodiment will be described with reference to FIGS. 20A and 20B. FIGS. 20A and 20B are diagrams illustrating the configurations of an image capturing system and a moving object according to the present embodiment, respectively.

FIG. 20A illustrates an example of an image capturing system for a car-mounted camera. An image capturing system 300 includes an image capturing apparatus 310. The image capturing apparatus 310 is the photoelectric conversion apparatus according to any one of the above embodiments. The image capturing system 300 further includes an image processing unit 312 that processes a plurality of image data obtained by the image capturing apparatus 310 and a disparity calculation unit 314 that calculates the disparity (the phase difference of the disparity images) from the plurality of image data obtained by the image capturing system 300. The image capturing system 300 further includes a distance measuring unit 316 that calculates a distance to the object from the calculated disparity and a collision determination unit 318 that determines whether there is a possibility of a collision from the calculated distance. The disparity calculation unit 314 and the distance measuring unit 316 are examples of a distance-information acquisition unit for obtaining object-distance information. In other words, the distance information is information on a disparity, a defocus amount, the distance to the object, and so on. The collision determination unit 318 may determine whether there is a collision possibility using any of the distance information. The distance-information acquisition unit may be implemented by specifically designed hardware or a software module. The distance-information acquisition unit may also be implemented by a field programmable gate array (FPGA), an application specific integrated circuit (ASIC), or a combination thereof.

The image capturing system 300 is connected to a vehicle-information acquisition apparatus 320 and can obtain vehicle information, such as a vehicle speed, a yaw rate, and a rudder angle. The image capturing system 300 is connected to an electronic control unit (ECU) 330, which is a control unit that outputs a control signal for generating a braking force for the vehicle based on the determination result of the collision determination unit 318. The image capturing system 300 is also connected to a warning device 340 that gives a warning to the driver based on the determination result of the collision determination unit 318. For example, if the collision determination unit 318 determines that there is a high collision possibility, the ECU 330 performs vehicle control to avoid a collision by putting on the brake, releasing the accelerator, or suppressing engine output, to reduce damages. The warning device 340 gives a warning to the user by sounding an alarm, displaying warning information on the screen of a car navigation system or the like, or vibrating the seat belt or the steering wheel.

The present embodiment captures images of the surroundings of the vehicle, for example, a forward image and a backward image, with the image capturing system 300. FIG. 20B illustrates the image capturing system capturing an image in front of the vehicle (an image capture region 350). The vehicle-information acquisition apparatus 320 sends an instruction to perform a predetermined operation to the image capturing system 300 or the image capturing apparatus 310. This configuration can further improve the accuracy of ranging.

Although the above is an example of control to avoid a collision with another vehicle, the image capturing system 300 may also be used in control to automatically follow another vehicle and control to automatically drive so as not to go out of the lane. The image capturing system may be used not only for vehicles, such as cars, but also for moving objects (moving apparatuses), such as ships, aircrafts, and industrial robots. In addition to the moving objects, the image capturing system may be broadly used in object recognition apparatuses, such as an intelligent transport system (ITS).

MODIFICATIONS

The disclosure is not limited to the above embodiments and may be variously modified.

The disclosure includes an embodiment in which part of the configuration of any of the embodiments is added to another embodiment and an embodiment in which part of the configuration of any of the embodiments is replaced with part of the configuration of another embodiment.

Although the above embodiments have been described using the solid-state image capturing apparatus including the photoelectric conversion unit PD that generates electrons as signal charges, the disclosure can also be applied to a solid-state image capturing apparatus including a photoelectric conversion unit PD that generates holes as signal charges. In this case, the conductivity type of the semiconductor regions constituting the elements of the pixels are reversed.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-224274 filed Nov. 29, 2018, which is hereby incorporated by reference herein in its entirety.

What is claimed is:

1. A photoelectric conversion apparatus comprising:
a semiconductor substrate having a first surface and a second surface,
wherein the semiconductor substrate includes:
at least one first semiconductor region of a first conductivity type at a first depth from the first surface;
a second semiconductor region of a second conductivity type disposed at a second depth deeper than the first depth from the first surface so as to be in contact with the first semiconductor region, wherein the second semiconductor region receives a first electric potential from the second surface; and a third semiconductor region of the second conductivity type extending from the first depth to a third depth shallower than the second depth and being in contact with the first semiconductor region and the second semiconductor region, wherein the third semiconductor region has a higher impurity concentration than the second semiconductor region and is subjected to a second electric potential lower than the first electric potential, the second electric potential being an electric potential for an electric charge serving as a carrier of a semiconductor region of the first conductivity type, and wherein the second semiconductor region has an impurity concentration of $1 \times 10^{12}$ [atom/cm$^3$] or less.

2. A photoelectric conversion apparatus comprising:
a semiconductor substrate having a first surface and a second surface,
wherein the semiconductor substrate includes:
   a first semiconductor region of a first conductivity type at a first depth from the first surface;
   a second semiconductor region of a second conductivity type disposed at a second depth deeper than the first depth from the first surface so as to be in contact with the first semiconductor region, wherein the second semiconductor region receives a first electric potential from the second surface; and
   a third semiconductor region of the second conductivity type extending from the first depth to a third depth shallower than the second depth and being in contact with the first semiconductor region and the second semiconductor region, wherein the third semiconductor region has a higher impurity concentration than the second semiconductor region and is subjected to a second electric potential lower than the first electric potential, the second electric potential being an electric potential for an electric charge serving as a carrier of a semiconductor region of the first conductivity type,
wherein the second semiconductor region has an electrical resistivity of 3,000 [Ω·cm] or more.

3. The photoelectric conversion apparatus according to claim 1, further comprising:
a fourth semiconductor region of the second conductivity type at a position nearer to the first surface than the first semiconductor region,
wherein the third semiconductor region is in contact with the fourth semiconductor region.

4. The photoelectric conversion apparatus according to claim 2, further comprising:
a fourth semiconductor region of the second conductivity type at a position nearer to the first surface than the first semiconductor region,
wherein the third semiconductor region is in contact with the fourth semiconductor region.

5. The photoelectric conversion apparatus according to claim 1, further comprising:
a fifth semiconductor region of the second conductivity type under a bottom of the first semiconductor region,
wherein the fifth semiconductor region has a higher impurity concentration than the second semiconductor region.

6. The photoelectric conversion apparatus according to claim 5, wherein the fifth semiconductor region and the third semiconductor region are in contact with each other.

7. The photoelectric conversion apparatus according to claim 1, further comprising:
a sixth semiconductor region of the second conductivity type extending along the second surface to a position deeper than the second depth from the first surface and having a higher impurity concentration than the second semiconductor region; and
a seventh semiconductor region of the second conductivity type extending from the first surface in a depth direction into contact with the sixth semiconductor region,
wherein the second semiconductor region receives the first electric potential through the sixth semiconductor region when the seventh semiconductor region receives an electrical potential.

8. The photoelectric conversion apparatus according to claim 1, wherein an electrode that applies the first electric potential to the second semiconductor region extends along the second surface.

9. The photoelectric conversion apparatus according to claim 8, further comprising an eighth semiconductor region of the second conductivity type between the electrode and the second semiconductor region, the eighth semiconductor region having a higher impurity concentration than the second semiconductor region.

10. The photoelectric conversion apparatus according to claim 8,
wherein light is incident on the first semiconductor region through the first surface, and
wherein the electrode includes metal that reflects light passing through the first semiconductor region and the second semiconductor region.

11. The photoelectric conversion apparatus according to claim 8,
wherein light is incident on the first semiconductor region through the second surface, and
wherein the electrode comprises a transparent electrode.

12. The photoelectric conversion apparatus according to claim 11, further comprising an antireflection film between the electrode and the second surface.

13. The photoelectric conversion apparatus according to claim 1, further comprising:
one or more micro lenses,
wherein the at least one first semiconductor region comprises a plurality of first semiconductor regions, and
wherein the plurality of first semiconductor regions are disposed in correspondence with the one microlens of the one or more micro lenses.

14. The photoelectric conversion apparatus according to claim 13, further comprising a ninth semiconductor region of the second conductivity type between the plurality of first semiconductor regions.

15. The photoelectric conversion apparatus according to claim 14, wherein the ninth semiconductor region is disposed from a depth at which the first semiconductor region is disposed to the third depth.

16. The photoelectric conversion apparatus according to claim 1, further comprising an insulating member in the third semiconductor region.

17. The photoelectric conversion apparatus according to claim 11, comprising:
a plurality of pixels each including the first semiconductor region and the third semiconductor region,
wherein the third semiconductor regions of the plurality of pixels are in contact with each other, and
wherein a contact for applying the second electric potential to the third semiconductor regions of the plurality of pixels is shared by the plurality of pixels.

18. The photoelectric conversion apparatus according to claim 1, comprising:
a first pixel on which visible light is incident; and
a second pixel on which light with a longer wavelength than wavelengths of visible light is incident, the first pixel and the second pixel each including the first semiconductor region,
wherein a tenth semiconductor region of the second conductivity type, an eleventh semiconductor region of the second conductivity type, and the third semiconductor region are disposed deeper than the first semiconductor region of the first pixel, with an increasing depth from the first surface, and
wherein the eleventh semiconductor region has a higher impurity concentration than the tenth semiconductor region and the third semiconductor region.

19. The photoelectric conversion apparatus according to claim 18, wherein the tenth semiconductor region is surrounded by the eleventh semiconductor region.

20. A photoelectric conversion system comprising:
the photoelectric conversion apparatus according to claim 1; and
a signal processing unit configured to process a signal output from the photoelectric conversion apparatus.

21. A photoelectric conversion system comprising:
the photoelectric conversion apparatus according to claim 2; and
a signal processing unit configured to process a signal output from the photoelectric conversion apparatus.

22. A photoelectric conversion system comprising:
the photoelectric conversion apparatus according to claim 18; and
a signal processing unit configured to process a signal output from the photoelectric conversion apparatus.

23. A moving object comprising:
the photoelectric conversion apparatus according to claim 1;
a distance-information acquisition unit configured to obtain distance information on distance to an object from a disparity image based on a signal from the photoelectric conversion apparatus; and
a control unit configured to control the moving object in accordance with the distance information.

24. A moving object comprising:
the photoelectric conversion apparatus according to claim 2;
a distance-information acquisition unit configured to obtain distance information on distance to an object from a disparity image based on a signal from the photoelectric conversion apparatus; and
a control unit configured to control the moving object in accordance with the distance information.

25. A moving object comprising:
the photoelectric conversion apparatus according to claim 18;
a distance-information acquisition unit configured to obtain distance information on distance to an object from a disparity image based on a signal from the photoelectric conversion apparatus; and
a control unit configured to control the moving object in accordance with the distance information.

* * * * *